(12) United States Patent
Lue et al.

(10) Patent No.: US 12,245,413 B2
(45) Date of Patent: Mar. 4, 2025

(54) THREE-DIMENSIONAL SEMICONDUCTOR STRUCTURES

(71) Applicant: Macronix International Co., Ltd., Hsinchu (TW)

(72) Inventors: Hang-Ting Lue, Hsinchu (TW); Wei-Chen Chen, Taoyuan (TW); Teng-Hao Yeh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 307 days.

(21) Appl. No.: 17/695,943

(22) Filed: Mar. 16, 2022

(65) Prior Publication Data

US 2023/0070119 A1 Mar. 9, 2023

Related U.S. Application Data

(60) Provisional application No. 63/241,098, filed on Sep. 7, 2021.

(51) Int. Cl.
*H01L 27/11* (2006.01)
*H10B 10/00* (2023.01)

(52) U.S. Cl.
CPC .................. *H10B 10/125* (2023.02)

(58) Field of Classification Search
CPC ......... H01L 21/8221; H01L 21/823475; H01L 21/823487; H01L 27/0207; H01L 27/0688; H01L 27/088; H01L 21/823871; H01L 21/823885; H01L 27/092; H01L 29/78642

See application file for complete search history.

(56) References Cited

U.S. PATENT DOCUMENTS

| 7,355,906 | B2 | 4/2008 | Joshi et al. | |
|---|---|---|---|---|
| 9,911,744 | B2 | 3/2018 | Liaw | |
| 10,312,229 | B2 | 6/2019 | Moroz et al. | |
| 10,381,070 | B2 | 8/2019 | Liaw | |
| 10,453,896 | B1 * | 10/2019 | Nazarian | H10N 70/023 |
| 2015/0325444 | A1 * | 11/2015 | Masuoka | H10B 10/125 438/268 |
| 2018/0122793 | A1 | 5/2018 | Moroz et al. | |

(Continued)

FOREIGN PATENT DOCUMENTS

| JP | 2011023543 A | 2/2011 |
|---|---|---|
| TW | 201937688 A | 9/2019 |

(Continued)

*Primary Examiner* — Walter H Swanson
(74) *Attorney, Agent, or Firm* — Fish & Richardson P.C.

(57) ABSTRACT

Methods, devices, systems, and apparatus for three-dimensional semiconductor structures are provided. In one aspect, a semiconductor device includes: a semiconductor substrate, multiple conductive layers vertically stacked on the semiconductor substrate, and multiple transistors. The multiple conductive layers include a first conductive layer, a second conductive layer, and a third conductive layer that are sequentially stacked together. The multiple transistors include a first transistor and a second transistor in the first conductive layer and a third transistor in the third conductive layer. Each transistor includes a first terminal, a second terminal, and a gate terminal. First terminals of the first, second, and third transistors are conductively coupled to a first conductive node in the second conductive layer.

27 Claims, 25 Drawing Sheets

(56) References Cited

U.S. PATENT DOCUMENTS

| | | |
|---|---|---|
| 2019/0386011 A1 | 12/2019 | Weekx et al. |
| 2020/0013896 A1 | 1/2020 | Xu et al. |
| 2020/0075489 A1* | 3/2020 | Liebmann ............. H01L 23/535 |
| 2020/0403617 A1 | 12/2020 | Lee et al. |
| 2021/0057023 A1 | 2/2021 | Liaw |
| 2021/0159232 A1 | 5/2021 | Liaw |

FOREIGN PATENT DOCUMENTS

| | | |
|---|---|---|
| TW | 202040791 A | 11/2020 |
| TW | 202042355 A | 11/2020 |
| TW | 202114158 A | 4/2021 |
| TW | 202123412 A | 6/2021 |
| TW | 202127631 A | 7/2021 |
| WO | WO 2009/119658 A1 | 10/2009 |
| WO | WO 2014/184933 A1 | 11/2014 |
| WO | WO 2016/163045 | 10/2016 |

* cited by examiner

THREE-DIMENSIONAL SEMICONDUCTOR STRUCTURES

CROSS-REFERENCE TO RELATED APPLICATION

This application claims priority under 35 USC § 119(e) to U.S. Provisional Patent Application Ser. No. 63/241,098, entitled "3D SRAM BY STACKED VERTICAL GAA TRANSISTORS" and filed on Sep. 7, 2021, the entire content of which is hereby incorporated by reference.

BACKGROUND

A current common requirement for an electronic circuit and particularly for electronic circuits manufactured as integrated circuits in semiconductor processes is an array of memory storage elements. These elements may be provided as static random access memory (SRAM) cells to form SRAM memories. Though SRAM has a faster access time than dynamic random-access memory (DRAM), SRAM is more expensive than DRAM as each SRAM cell requires multiple transistors. For example, a 6T SRAM cell includes six transistors. Moreover, the SRAM cell occupies a much larger area than a DRAM cell, which results in SRAM having a smaller density than DRAM. However, it is challenging to produce small size SRAM cells as advanced Complementary metal-oxide-semiconductor (CMOS) technologies may be required.

SUMMARY

The present disclosure describes methods, systems, and techniques for three-dimensional (3D) semiconductor structures, e.g., using stacked vertical gate-all-around (GAA) transistor architectures to form SRAM cell structures.

One aspect of the present disclosure features a semiconductor device including: a semiconductor substrate; multiple conductive layers vertically stacked along a vertical direction on the semiconductor substrate, the multiple conductive layers including a first conductive layer, a second conductive layer, and a third conductive layer that are sequentially stacked together; and multiple transistors including a first transistor and a second transistor in the first conductive layer and a third transistor in the third conductive layer, each transistor including a first terminal, a second terminal, and a gate terminal. First terminals of the first, second, and third transistors are conductively coupled to a first conductive node in the second conductive layer.

In some embodiments, the first conductive layer and the third conductive layer are made of a first conductive material, and the second conductive layer is made of a second conductive material different from the first conductive material.

In some embodiments, the multiple transistors further include fourth, fifth, and sixth transistors, the fourth and sixth transistors are in the first conductive layer, and the fifth transistor is in the third conductive layer, and first terminals of the fourth, fifth, and sixth transistors are conductively coupled to a second conductive node in the second conductive layer.

In some embodiments, the semiconductor device further includes a staircase region configured to separate the first conductive layer, the second conductive layer, and the third conductive layers into two parts that are conductively insulated from each other. The first transistor and the second transistor can be in a first part of the first conductive layer, and the fourth transistor and the sixth transistor can be in a second part of the first conductive layer. The first conductive node can be in a first part of the second conductive layer, and the second conductive node can be in a second part of the second conductive layer. The third transistor can be in a first part of the third conductive layer, and the fifth transistor can be in a second part of the third conductive layer.

In some embodiments, the staircase region includes first and second staircase sub-regions that are symmetrical to each other. The semiconductor device can further include: a first set of VIAs vertically penetrating through the first staircase sub-region and respectively coupling to conductive pads on the first parts of the first, second, and third conductive layers, and a second set of VIAs vertically penetrating through the second staircase sub-region and respectively coupling to conductive pads on the second parts of the first, second, and third conductive layers.

In some embodiments, the semiconductor device further includes a first metallic layer above the first, second, and third conductive layers. A first conductive line in the first metallic layer can be configured to conductively couple the first conductive node to a gate terminal of the fourth transistor in the first conductive layer and a gate terminal of the fifth transistor in the third conductive layer, and a second conductive line in the first metallic layer can be configured to conductively couple the second conductive node to a gate terminal of the second transistor in the first conductive layer and a gate terminal of the third transistor in the third conductive layer.

In some embodiments, second terminals of the first transistor and the sixth transistor in the first conductive layer are coupled to a pair of first signal lines formed in a second metallic layer, gate terminals of the first transistor and the sixth transistor in the first conductive layer are coupled to a second signal line formed in a third metallic layer, and the first metallic layer, the second metallic layer, and the third metallic layer are vertically stacked together above the multiple conductive layers.

In some embodiments, the first conductive line and the second conductive line are conductively insulated from each other in the first metallic layer and extend along a horizontal direction perpendicular to the vertical direction. The first conductive line in the first metallic layer is respectively coupled to the gate terminal of the fourth transistor in the first conductive layer, the first conductive node in the second conductive layer, and the gate terminal of the fifth transistor in the third conductive layer with a first set of VIAs penetrating through a first staircase sub-region along the vertical direction. The second conductive line in the first metallic layer is respectively coupled to the gate terminal of the second transistor in the first conductive layer, the second conductive node in the second conductive layer, and the gate terminal of the third transistor in the third conductive layer with a second set of VIAs penetrating through a second staircase sub-region along the vertical direction.

In some embodiments, the semiconductor device includes a pair of inverters including a first inverter having the first, second, and third transistors and a second inverter having the fourth, fifth, sixth transistors. The first and sixth transistors are pass gate transistors in the first and second inverters, respectively, the second and fourth transistors are pull up transistors in the first and second inverters, respectively, and the third and fifth transistors are pull down transistors in the first and second inverters, respectively.

In some embodiments, second terminals of the second transistor and the fourth transistor in the first conductive layer are conductive coupled to a first supply voltage, and second terminals of the third transistor and the fifth transistor in the third conductive layer are conductive coupled to a second supply voltage.

In some embodiments, the multiple transistors further include: another second transistor in the third conductive layer that shares a gate terminal of the third transistor, and another fourth transistor in the third conductive layer that shares a gate terminal of the fifth transistor.

In some embodiments, gate terminals of the first transistor and the second transistor are conductively insulated from each other by a first insulating slit extending along the vertical direction through the first conductive layer onto the second conductive layer, and gate terminals of the fourth transistor and the sixth transistor are conductively insulated from each other by a second insulating slit extending along the vertical direction through the first conductive layer onto the second conductive layer.

In some embodiments, the semiconductor device is configured to be a 6T SRAM cell. The 6T SRAM cell can be coupled to a nonvolatile memory cell in a gate-all-around (GAA) transistor architecture.

In some embodiments, the first transistor and the third transistor are transistors of a first dopant type, and the second transistor is a transistor of a second dopant type that is different from the first dopant type. The first dopant type can be N dopant type, and the second dopant type can be P dopant type.

In some embodiments, the semiconductor substrate includes a first doped region having a first dopant type and a second doped region having a second dopant type, the first doped region and the second doped region being conductively insulated from each other, and the semiconductor device includes multiple semiconductor pillars extending through the multiple conductive layers onto the semiconductor substrate, and the multiple semiconductor pillars include a first semiconductor pillar extending onto the first doped region and a second semiconductor pillar extending onto the second doped region.

In some embodiments, each of the first semiconductor pillar and the second semiconductor pillar is surrounded by a gate dielectric structure in the first conductive layer and the third conductive layer, and each of the first semiconductor pillar and the second semiconductor pillar is surrounded by a metallic structure in the second conductive layer.

In some embodiments, the first semiconductor pillar includes a first portion above the multiple conductive layers and a second portion surrounded by the metallic structure in the second conductive layer, and the first portion and the second portion of the first semiconductor pillar are doped with the first dopant type. In some embodiments, the second semiconductor pillar includes a third portion above the multiple conductive layers and a fourth portion surrounded by the metallic structure in the second conductive layer, and where the third portion and the fourth portion of the second semiconductor pillar are doped with the second dopant type.

In some embodiments, the first transistor includes a first portion of the first conductive layer, a first portion of the second semiconductor pillar surrounded by a first gate dielectric structure in the first conductive layer, and the first gate dielectric structure, the second transistor includes a second portion of the first conductive layer, a first portion of the first semiconductor pillar surrounded by a second gate dielectric structure in the first conductive layer, and the second gate dielectric structure, and the third transistor includes a portion of the third conductive layer, a second portion of the second semiconductor pillar surrounded by a third gate dielectric structure in the third conductive layer, and the third gate dielectric structure.

In some embodiments, the semiconductor device is configured to be between adjacent conductive slits extending along the vertical direction through the multiple conductive layers onto the semiconductor substrate.

Another aspect of the present disclosure features a semiconductor device including: a semiconductor substrate; multiple conductive layers vertically stacked on the semiconductor substrate including a bottom conductive layer, a middle conductive layer, and a top conductive layer that are sequentially stacked together; a first semiconductor pillar vertically penetrating through the bottom, middle, and top conductive layers onto the semiconductor substrate, the first semiconductor pillar including a first bottom portion surrounded by the bottom conductive layer, a first middle portion surrounded by the middle conductive layer, and a first top portion surrounded by the top conductive layer; and a plurality of gate dielectric structures including a first gate dielectric structure surrounded by the first bottom portion and the bottom conductive layer and a second gate dielectric structure surrounded by the first top portion and the top conductive layer. The first middle portion of the first semiconductor pillar is conductively coupled to the middle conductive layer.

In some embodiments, the semiconductor device further includes: a second semiconductor pillar vertically penetrating through the multiple conductive layers onto the semiconductor substrate, the second semiconductor pillar including a second bottom portion surrounded by the bottom conductive layer, a second middle portion surrounded by the middle conductive layer, and a second top portion surrounded by the top conductive layer. In some embodiments, the plurality of gate dielectric structures including a third gate dielectric structure surrounded by the second bottom portion and the bottom conductive layer and a fourth gate dielectric structure surrounded by the second top portion and the top conductive layer. In some embodiments, the second middle portion of the second semiconductor pillar is conductively coupled to the middle conductive layer.

In some embodiments, the semiconductor substrate includes a first dopant type region and a second dopant type region, and the first semiconductor pillar vertically extends onto the first dopant type region, and the second semiconductor pillar vertically extends onto the second dopant type region.

In some embodiments, the semiconductor device further includes a plurality of metallic structures in the middle conductive layer. In some embodiments, the plurality of metallic structures include: a first metallic structure surrounded by the first middle portion of the first semiconductor pillar and the middle conductive layer, and a second metallic structure surrounded by the second middle portion of the second semiconductor pillar and the middle conductive layer.

In some embodiments, the bottom conductive layer includes: a first conductive portion surrounding the first gate dielectric structure and the first semiconductor pillar and a second conductive portion surrounding the third gate dielectric structure and the second semiconductor pillar, the first conductive portion and the second conductive portion at least partially overlapping with each other between the first gate dielectric structure and the second gate dielectric structure. In some embodiments, the top conductive layer includes: a third conductive portion surrounding the second gate dielectric structure and the first semiconductor pillar and a fourth conductive portion surrounding the fourth gate dielectric structure and the second semiconductor pillar, the third conductive portion and the fourth conductive portion being separated and insulated from each other between the third gate dielectric structure and the fourth gate dielectric structure.

In some embodiments, the semiconductor device further includes: a third semiconductor pillar vertically penetrating through the multiple conductive layers onto the semiconductor substrate, the third semiconductor pillar including a third bottom portion in the bottom conductive layer, a third middle portion surrounded by the middle conductive layer, and a third top portion surrounded by the top conductive layer, where the plurality of gate dielectric structures including a fifth gate dielectric structure surrounded by the third bottom portion and the bottom conductive layer and a sixth gate dielectric structure surrounded by the third top portion and the top conductive layer, and where the third middle portion of the third semiconductor pillar is conductively coupled to the middle conductive layer.

In some embodiments, the semiconductor device further includes: a fourth semiconductor pillar vertically penetrating through the multiple conductive layers onto the semiconductor substrate, the fourth semiconductor pillar including a fourth bottom portion in the bottom conductive layer, a fourth middle portion surrounded by the middle conductive layer, and a fourth top portion surrounded by the top conductive layer, where the plurality of gate dielectric structures including a seventh gate dielectric structure surrounded by the fourth bottom portion and the bottom conductive layer and an eighth gate dielectric structure surrounded by the fourth top portion and the top conductive layer, and where the fourth middle portion of the fourth semiconductor pillar is conductively coupled to the middle conductive layer.

In some embodiments, the semiconductor device further includes a metallic layer above the multiple conductive layer. The middle conductive layer includes a first portion where the first and second semiconductor pillars penetrate through and a second portion where the third and fourth semiconductor pillars penetrate through, the first portion and the second portion being insulated from each other. A first conductive line in the metallic layer is configured to conductively couple the first portion of the middle conductive layer to a portion of the top conductive layer surrounding the fourth semiconductor pillar and the eighth gate dielectric structure and a portion of the bottom conductive layer surrounding the third semiconductor pillar and the fifth gate dielectric structure. A second conductive line in the metallic layer is configured to conductively couple the second portion of the middle conductive layer to a portion of the top conductive layer surrounding the first semiconductor pillar and the third gate dielectric structure and a portion of the bottom conductive layer surrounding the second semiconductor pillar and the second gate dielectric structure.

Another aspect of the present disclosure features a memory device including: a plurality of memory cells on a semiconductor substrate and a metallic layer formed above the plurality of memory cells. Each of the plurality of memory cells includes: multiple conductive layers vertically stacked on the semiconductor substrate, the multiple conductive layers including a first conductive layer, a second conductive layer, and a third conductive layer that are sequentially stacked together; and multiple transistors including six transistors, each of the six transistors including a first terminal, a second terminal, and a gate terminal. First, second, fourth, sixth transistors are in the first conductive layer and third and fifth transistors are in the third conductive layer, and where first terminals of the first, second, and third transistors are conductively coupled to a first conductive node in the second conductive layer, and first terminals of the fourth, fifth, and sixth transistors are conductively coupled to a second conductive node in the second conductive layer. A first conductive line in the metallic layer is configured to conductively couple the first conductive node to a gate terminal of the fourth transistor in the first conductive layer and a gate terminal of the fifth transistor in the third conductive layer. A second conducive line in the metallic layer is configured to conductively couple the second conductive node to a gate terminal of the second transistor in the first conductive layer and a gate terminal of the third transistor in the third conductive layer.

Another aspect of the present disclosure features a semiconductor device, including: a substrate and a vertical stack arranged on the substrate. The vertical stack includes a bottom conductive layer, a middle conductive layer above the bottom conductive layer, and a top conductive layer above the middle conductive layer. The semiconductor device further includes a first semiconductor pillar that vertically penetrates the vertical stack and includes a first bottom portion surrounded by the bottom conductive layer, a first middle portion surrounded by the middle conductive layer, and a first top portion surrounded by the top conductive layer. The semiconductor device further includes a plurality of gate dielectric structures located between the first bottom portion and the bottom conductive layer and between the first top portion and the top conductive layer. The first middle portion is conductively coupled (or electrically connected) to the middle conductive layer.

In some embodiments, the top conductive layer includes a first top segment, a second top segment, a third top segment and a fourth top segment separately formed from each other. The middle conductive layer includes a first middle segment and a second middle segment separately formed from each other. The bottom conductive layer includes a first bottom segment and a second bottom segment separately formed from each other. The first top portion of the first semiconductor pillar is surrounded by the first top segment of the top conductive layer, the first middle portion of the first semiconductor pillar is surrounded by the first middle segment of the middle conductive layer, and the first bottom portion of the first semiconductor pillar is surrounded by the first bottom segment of the bottom conductive layer.

In some embodiments, the semiconductor device further includes a second semiconductor pillar vertically penetrates the vertical stack. The second semiconductor pillar includes a second bottom portion surrounded by the first bottom segment of the bottom conductive layer, a second middle portion surrounded by the middle conductive layer, and a second top portion surrounded by the second top segment of the top conductive layer. The plurality of gate dielectric structures located between the second bottom portion of the second semiconductor pillar and the first bottom segment of the bottom conductive layer, and between the second top portion of the second semiconductor pillar and the second top segment of the top conductive layer. The second middle portion of the second semiconductor pillar is conductively coupled to the first middle segment of the middle conductive layer.

In some embodiments, the substrate includes a first dopant type well region (e.g., a first doped region with a first dopant type) and a second dopant type well region (e.g., a second doped region with a second dopant type), the first semiconductor pillar is conductively coupled to the first dopant type well region, and the second semiconductor pillar is conductively coupled to the second dopant type well region.

In some embodiments, the semiconductor device further includes: a third semiconductor pillar vertically penetrates the vertical stack and conductively coupled to the first dopant type well region. The third semiconductor pillar includes a third bottom portion surrounded by the second bottom segment of the bottom conductive layer, a third middle portion surrounded by the second middle segment of the middle conductive layer, and a third top portion surrounded by the third top segment of the top conductive layer. The plurality of gate dielectric structures located between the third bottom portion of the third semiconductor pillar and the second bottom segment of the bottom conductive layer, and between the third top portion of the third semiconductor pillar and the third top segment of the top conductive layer; and the third middle portion of the third semiconductor pillar is conductively coupled to the second middle segment of the middle conductive layer.

In some embodiments, the semiconductor device further includes: a fourth semiconductor pillar vertically penetrates the vertical stack and conductively coupled to the second dopant type well region. The fourth semiconductor pillar includes a fourth bottom portion surrounded by the second bottom segment of the bottom conductive layer, a fourth middle portion surrounded by the second middle segment of the middle conductive layer, and a fourth top portion surrounded by the fourth top segment of the top conductive layer. The plurality of gate dielectric structures are located between the fourth bottom portion of the fourth semiconductor pillar and the second bottom segment of the bottom conductive layer, and between the fourth top portion of the fourth semiconductor pillar and the fourth top segment of the top conductive layer. The fourth middle portion of the fourth semiconductor pillar is conductively coupled to the second middle segment of the middle conductive layer.

In some embodiments, the semiconductor device further includes a wiring layer that includes a first wiring connector electrically couple to the first bottom segment of the bottom conductive layer, the second middle segment of the middle conductive layer, and the second top segment of the top conductive layer.

In some embodiments, the wiring layer includes a second wiring connector that is electrically couple to the second bottom segment of the bottom conductive layer, the first middle segment of the middle conductive layer, and the fourth top segment of the top conductive layer.

In some embodiments, the semiconductor device further includes: a plurality of metal silicide structure located in the intersection between the first middle portion of the first semiconductor pillar and the first middle segment of the middle conductive layer, between the second middle portion of the second semiconductor pillar and the first middle segment of the middle conductive layer, between the third middle portion of the third semiconductor pillar and the second middle segment of the middle conductive layer, and between the fourth middle portion of the fourth semiconductor pillar and the second middle segment of the middle conductive layer.

In some embodiments, the first semiconductor pillar is electrically coupled to a first signal line, and the third semiconductor pillar is electrically coupled to a second signal line, the second semiconductor pillar and the fourth semiconductor pillar are electrically coupled to a power line $V_{CC}$.

In some embodiments, the semiconductor device forms a 6T (six transistors) SRAM device. In some embodiments, a cell size of the semiconductor device is equal to or smaller than 0.032 $\mu m^2$.

Another aspect of the present disclosure features a manufacture method of a semiconductor device substantially as described herein.

Another aspect of the present disclosure features a semiconductor device that includes a 6T SRAM cell and Flash memory cell. Both 6T SRAM cell and the Flash memory cell are gate-all-around (GAA) architecture.

Individual components of a semiconductor device can be substantially as described herein and in any reasonable combinations.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
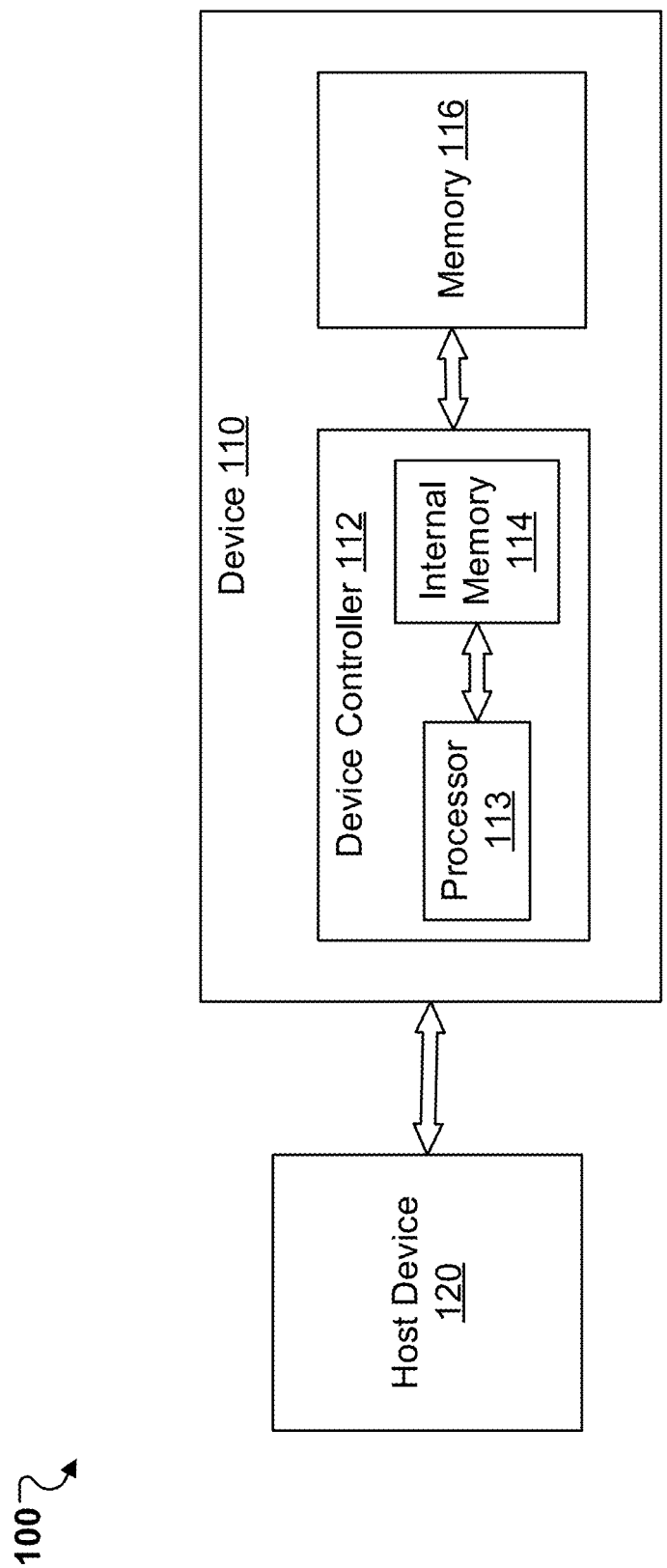
FIG. 1 illustrates an example of a system including a memory.

In the present disclosure, 6T SRAM cell is used as an example for explanation of the features, which does not limit the embodiments or the appended claims. Implementations of the present disclosure may be further extended to SRAM cells with more than six transistors, e.g., 8T SRAM cell, 10T SRAM cell, and to any content addressable memory (CAM) cells.

The techniques implemented in the present disclosure can provide SRAM cells with small size but high performance. The techniques use stacked vertical GAA transistor structures that can greatly save not only transistor areas but also contact areas to thereby reduce SRAM cell areas. Moreover, the cell area scaling is mostly limited by non-active staircase contact area. That means, once a process window control (e.g., staircase design rule and/or contact rule) is improved, the SRAM cell size can be further scaled to be much smaller than what advanced CMOS can provide, without CMOS transistor issues. For example, a 6T SRAM cell size can be reduced to be smaller than 0.032 $\mu m^2$ (equivalent to N7 node) or even to 0.006 $\mu m^2$ (equivalent to N1 node).

The techniques can provide SRAM memories with high performance. For example, the SRAM memories can achieve low energy per bit (e.g., ~10 fJ/bit in single 6T SRAM cell), low operational voltage (e.g., <=1V), unlimited endurance, and fast access time (~ns). The SRAM memories can be implemented with a reasonable transistor ON/OFF ratio and without developing exotic new materials (e.g., for other memories) that can be unpredictable. The SRAM memories can also achieve a very low raw bit error rate (RBER) with a well-controlled transistor threshold voltage Vth, e.g., using GAA architecture. The SRAM memories can be configured for advanced computing to produce ~PB/s bandwidth. The SRAM memories can be also used as scratchpad storage or working data storage, such as in cache memory for processors. For example, the SRAM memories can be integrated with one or more processor cores (e.g., microcontrollers or microprocessors) using system on a chip (SoC) designs. The processor cores may be arranged with a level one (L1) cache memory of SRAM cells laid out or adjacent to the processor on a semiconductor substrate to make very fast processing operations possible.

The techniques implemented in the present disclosure can fabricate SRAM cells using existing manufacture technologies, which can avoid issues caused by shrinking the features of SRAM cells, such as increased contact resistance, reduced contact hole sizes, and reduced tolerances in photolithography. The techniques can also reduce multiple patterning steps required in the photolithography processing to reduce cost and improve throughput of the manufacturing processes.

The techniques implemented in the present disclosure can be applied to any other structures that include a number of transistors or other semiconductor components, e.g., storage elements or circuits. The techniques implemented in the present disclosure can be applied to various memory types, such as SLC (single-level cell) devices, MLC (multi-level cell) devices like 2-level cell devices, TLC (triple-level cell) devices, or QLC (quad-level cell) devices. The techniques can be applied to various dimensions of memory devices or systems, such as three-dimensional (3D) memory devices or systems. The techniques can be applied to various types of volatile or nonvolatile memory devices or systems or any suitable combination thereof. For example, SRAM can be integrated with nonvolatile memory devices (e.g., flash memory devices), where a nonvolatile storage cell structure (e.g., an electrically erasable programmable read-only memory (EEPROM) cell structure) can be integrated with an SRAM cell structure using GAA architecture in a same or similar process flow.

Additionally or alternatively, the techniques can be applied to various types of devices and systems, such as secure digital (SD) cards, embedded multimedia cards (eMMC), or solid-state drives (SSDs), embedded systems, media players, mobile devices, among others.

FIG. 1 illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. The SRAM can be made of SRAM cells, e.g., as illustrated in FIGS. 3A-3D, and can include SRAM cell arrays, e.g., as illustrated in FIGS. 4A-4C. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a nonvolatile memory configured for long-term storage of instructions and/or data, e.g., a NAND flash memory device, or some other suitable nonvolatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. In some implementations, the memory 116 is a volatile memory configured for cache memory. In some implementations, the memory 116 includes both nonvolatile memory cell arrays and volatile memory cell arrays.

Figure 2:
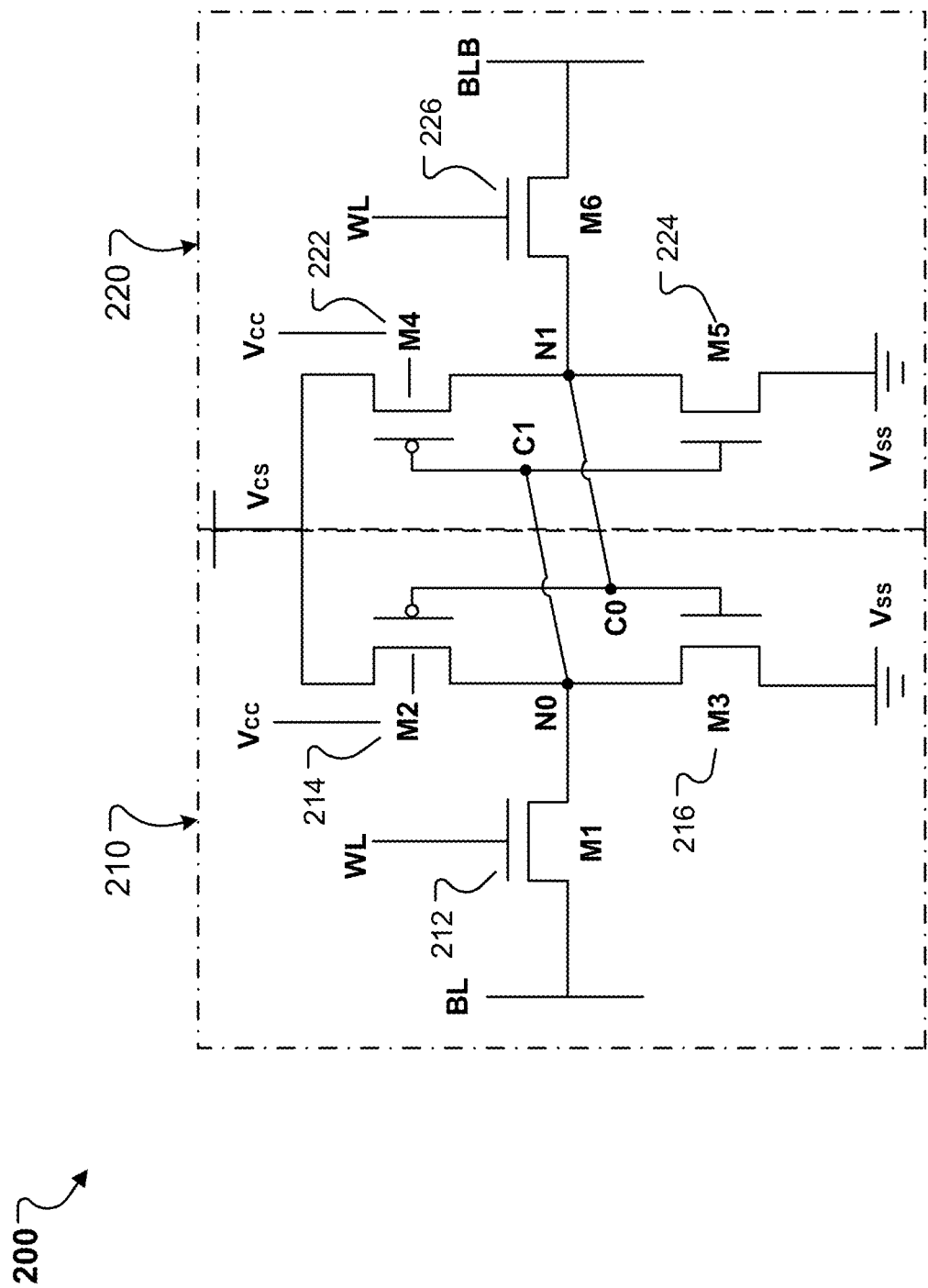
FIG. 2 illustrates an example 6T SRAM cell circuit.

FIG. 2 illustrates an example circuit 200 of a 6T SRAM cell. The circuit 200 has a 6T arrangement including six transistors arranged in a pair of inverters 210 and 220 each including three transistors.

As illustrated in FIG. 2, a pair of pass gate transistors 212, 226 (labeled M1 and M6) couple a pair of bit lines BL and BLB to nodes labeled N0 and N1, respectively. The pass gate transistors M1 and M6 can be formed of metal-oxide-silicon (MOS) transistors. In this example, the transistors M1 and M6 are implemented as N-type MOS transistors, e.g., NMOS transistors. A positive supply voltage $V_{CC}$ (and $V_{CS}$), which may be from 0.3 Volts to 3.0 or more volts, depending on the process technology, is shown. Pull up transistors 214, 222 (labeled M2 and M4) are formed as P-type transistors (e.g., PMOS transistors) and couple the positive supply $V_{CC}$ to one or the other data nodes, depending on the state of the SRAM cell. A second supply voltage $V_{SS}$, e.g., a negative or ground voltage, is shown and is coupled to the data nodes by pull down transistors 216, 224 (labeled as M3 and M5).

The two pull down transistors M3 and M5 couple the second supply voltage $V_{SS}$ to one or the other node labeled N0 and N1, depending on the state of data stored in the SRAM cell. The SRAM cell is a latch that can retain its data state indefinitely, so long as the supplied power is sufficient to operate the circuit correctly. The two inverters 210 including M2, M3 and 220 including M4, M5, respectively, are cross-coupled and operate to reinforce the stored charge on the nodes N0 and N1 continuously. For example, as illustrated in FIG. 2, the node N0 in the inverter 210 is coupled to a node C1 in the inverter 220, while the node N1 in the inverter 220 is coupled to a node C0 in the inverter 210. The two nodes N0 and N1 are inverted from each other. When N0 is a logical "1", e.g., at a high voltage, N1 is at the same time a logical "0", e.g., at a low voltage, and vice versa.

When the SRAM cell is written to, complementary write data signals are placed on the bit line pair BL and BLB. A positive control signal on a word line (WL) is coupled to the gates of both pass gate transistors M1 and M6. The transistors M2, M3 and M4, M5 and the pass gates transistors M1 and M6 are configured such that the write data on the bit lines may overwrite the stored data at the nodes N0 and N1, and thus write the SRAM bit cell to a desired state.

When the SRAM cell is read from, a positive voltage is placed on the word line WL, and the pass gate transistors M1 and M6 allow the bit lines BL and BLB to be coupled to, and receive the data from, the nodes N0 and N1. Unlike a dynamic memory or DRAM cell, the SRAM cell does not lose its stored state during a read, so no data "write back" operation is required after a read.

The bit lines BL and BLB form a complementary pair of data lines. The paired data lines may be coupled to a differential sense amplifier, and the differential voltage read from SRAM cells can be sensed and amplified. The amplified sensed signal, which is at a logic level voltage, may then be output as read data to other logic circuitry in the device.

As discussed with further details below, the SRAM cell of FIG. 2 can be formed in three dimensions, e.g., by using stacked vertical GAA transistor architectures, which can greatly reduce a size of the SRAM cell.

Figure 3A:
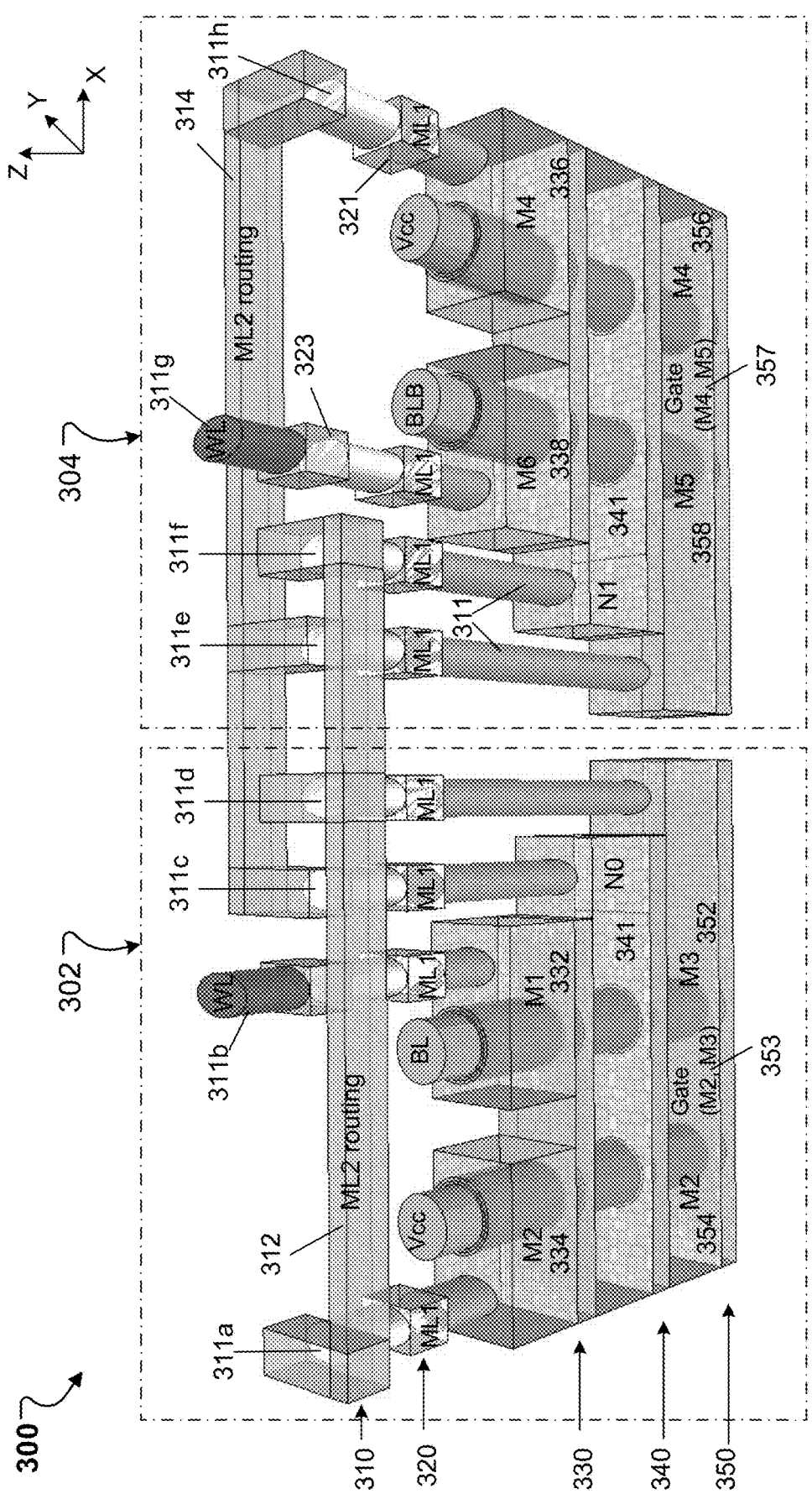
FIGS. 3A-3D illustrate an example 3D SRAM cell structure.
Figure 3B:
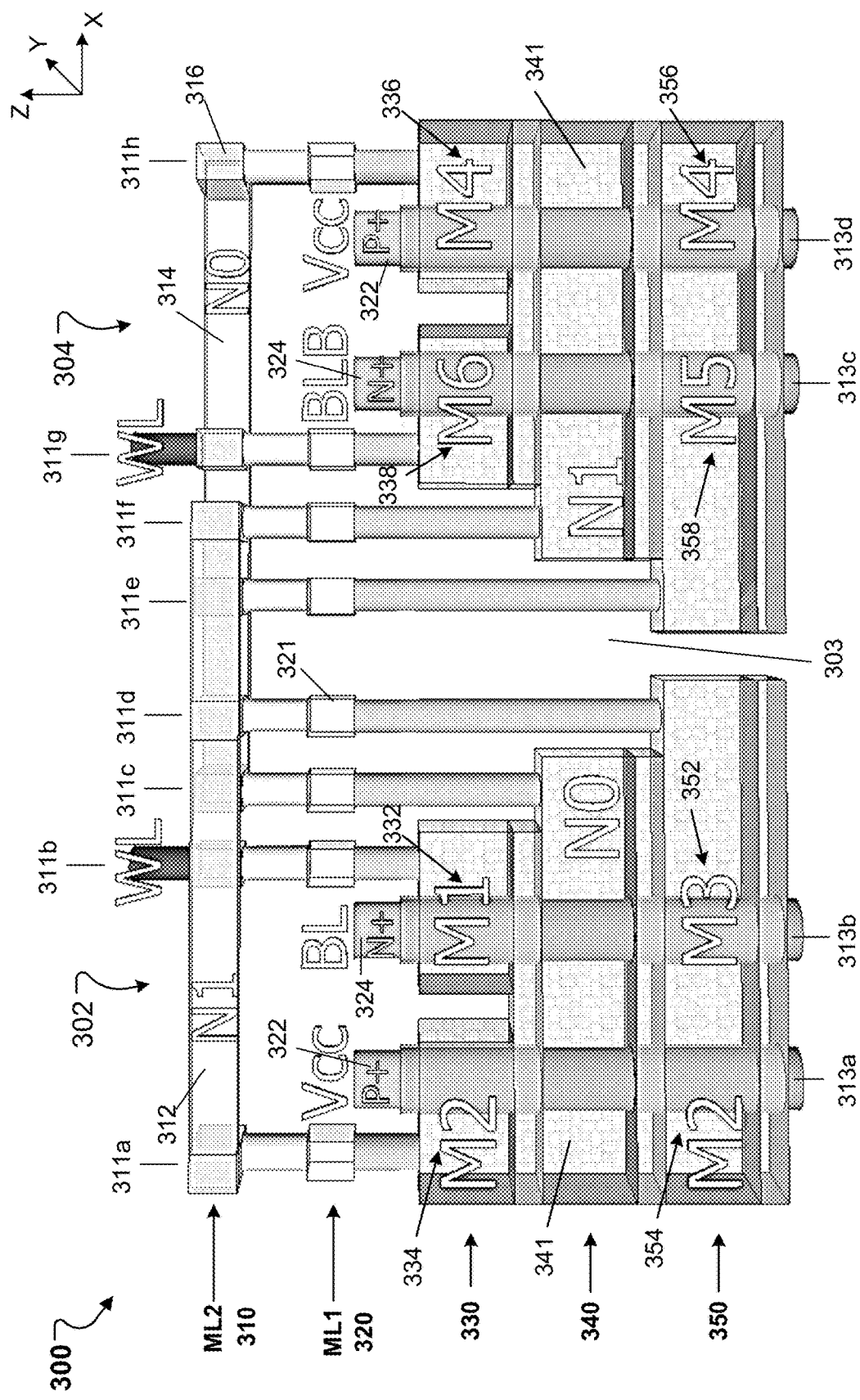
Figure 3C:
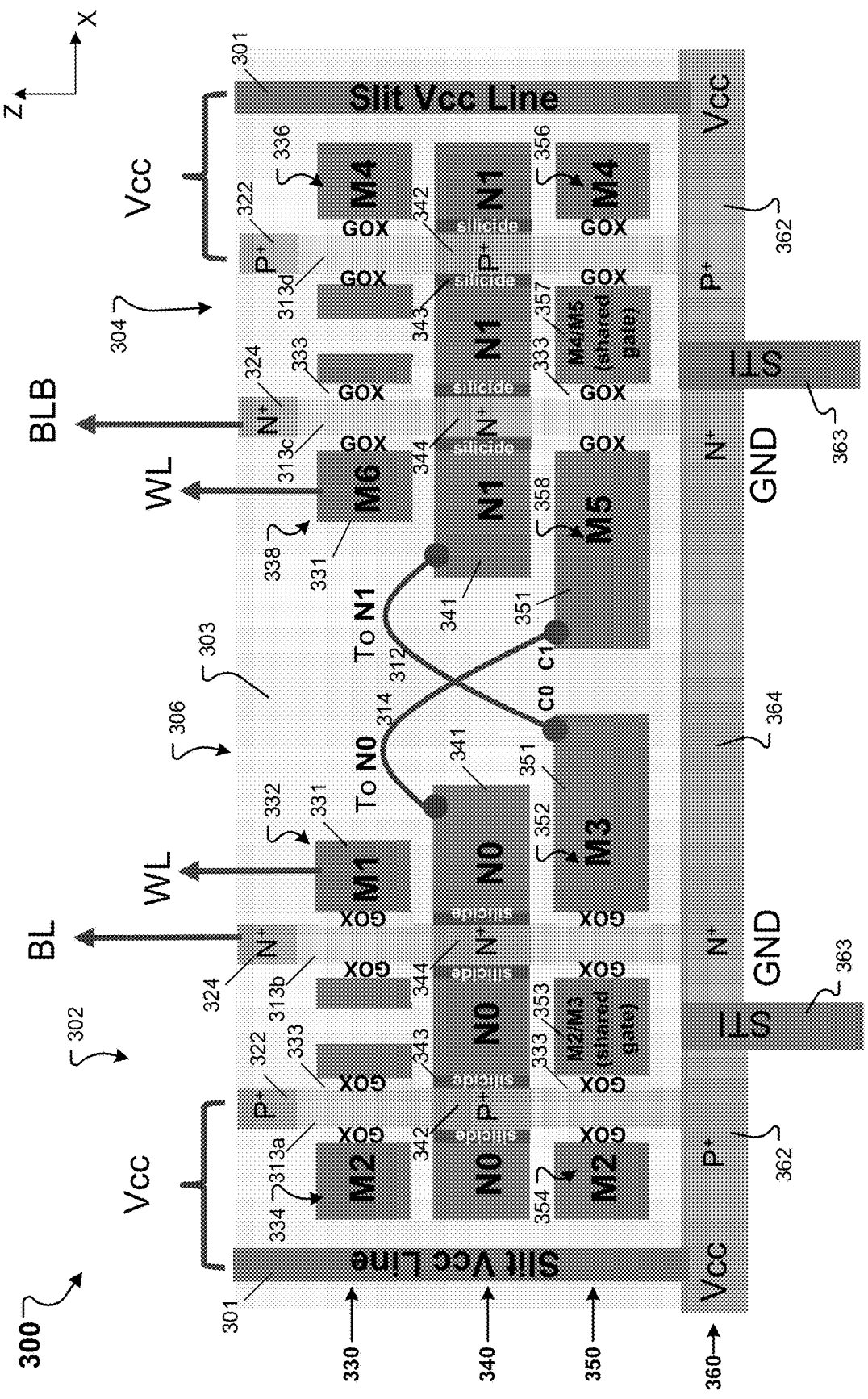
Figure 3D:
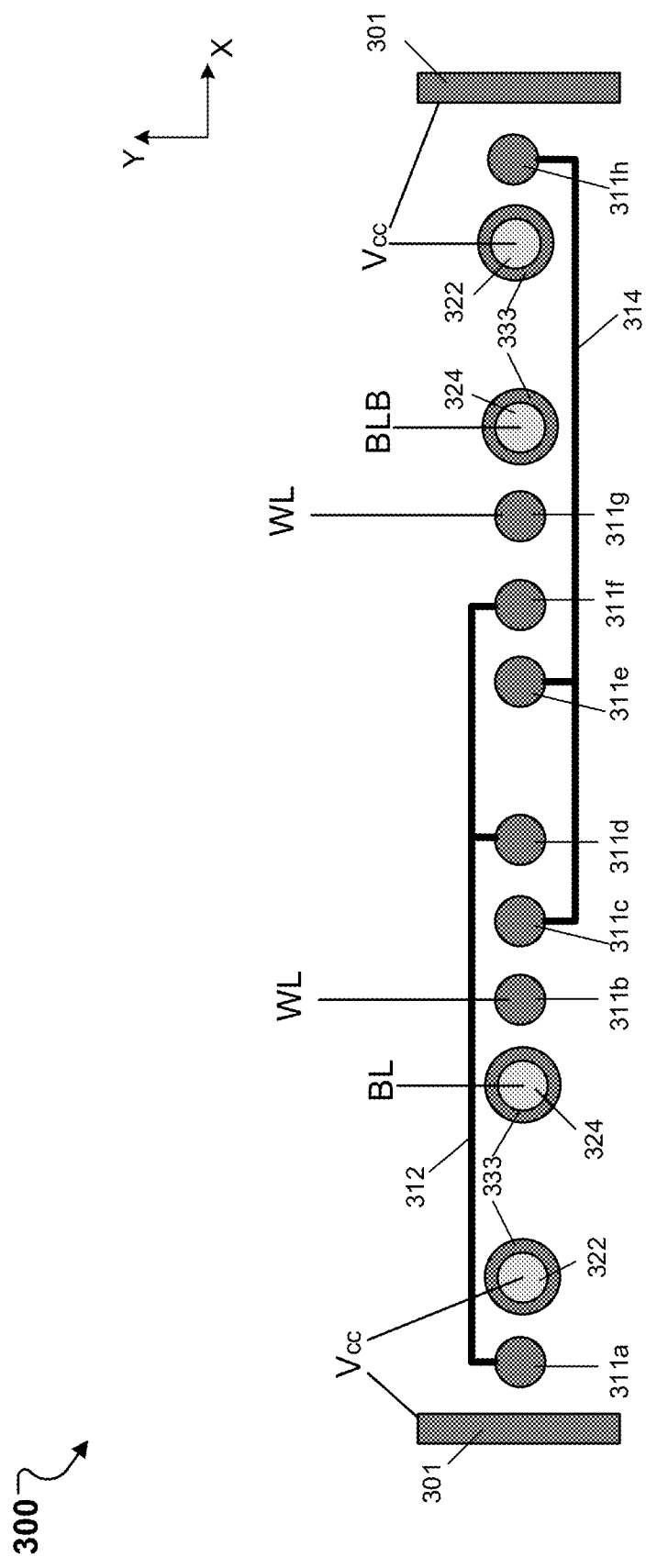
Figure 4A:
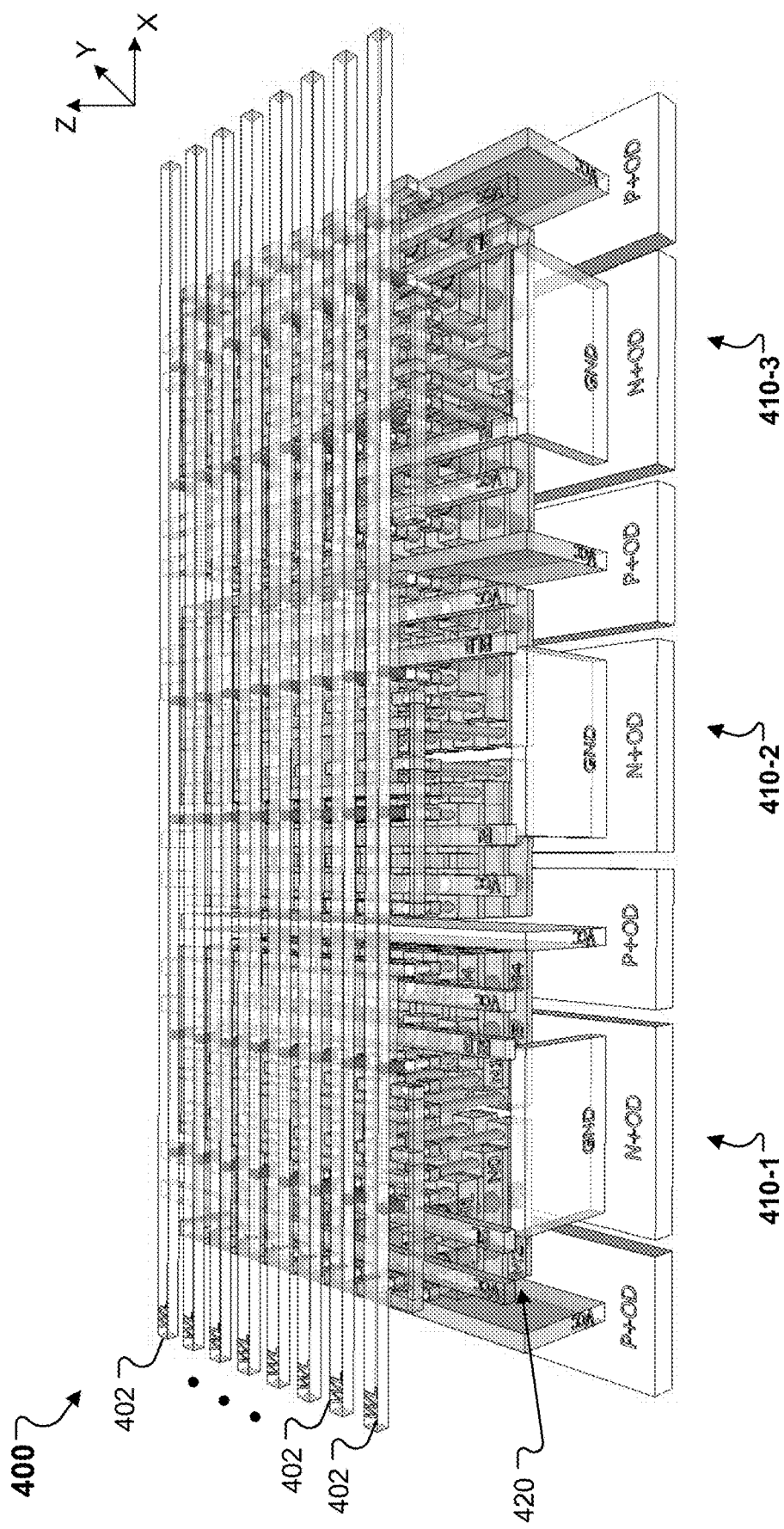
FIGS. 4A-4C illustrate an example SRAM device using 3D SRAM cell structures.
Figure 4B:
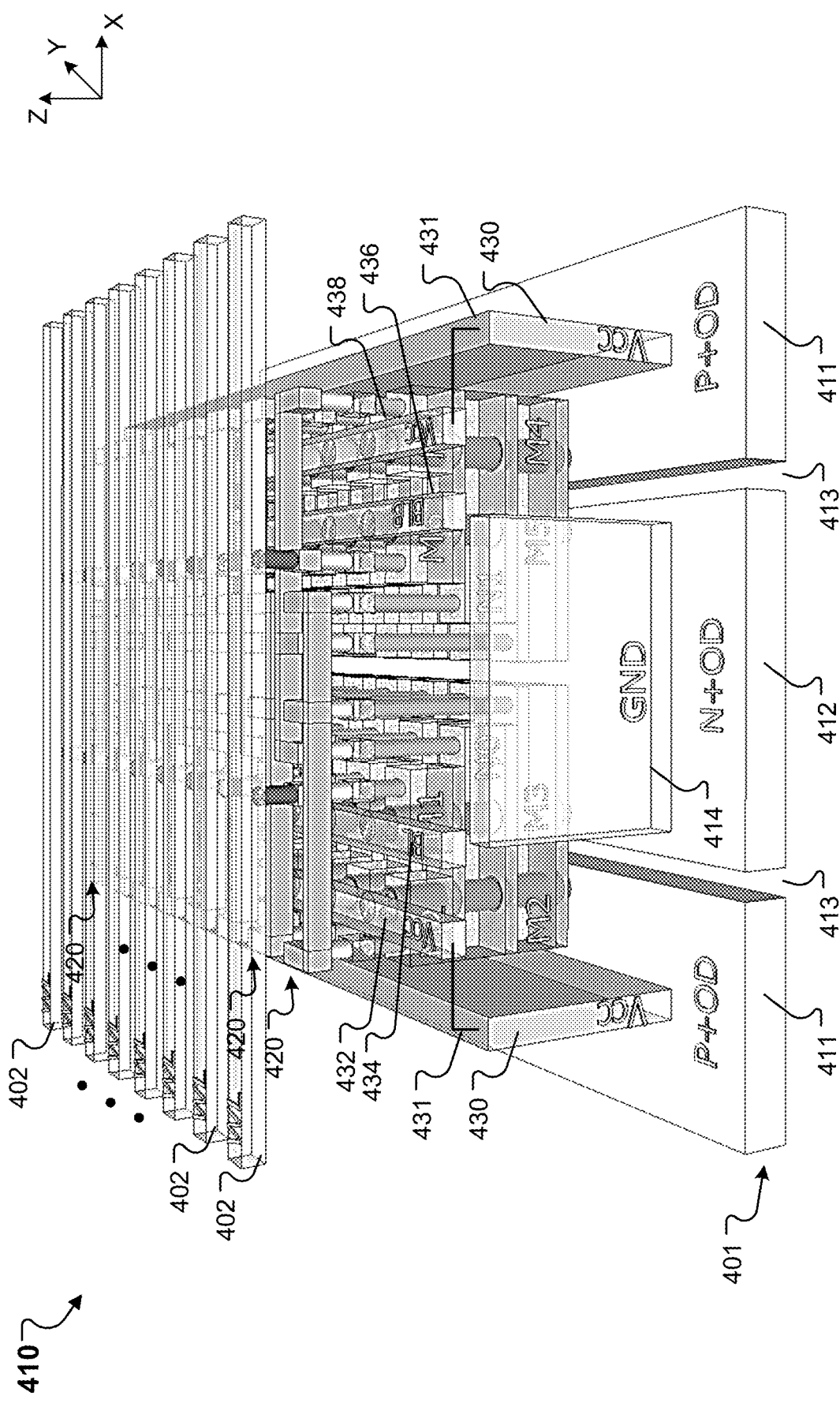
Figure 4C:
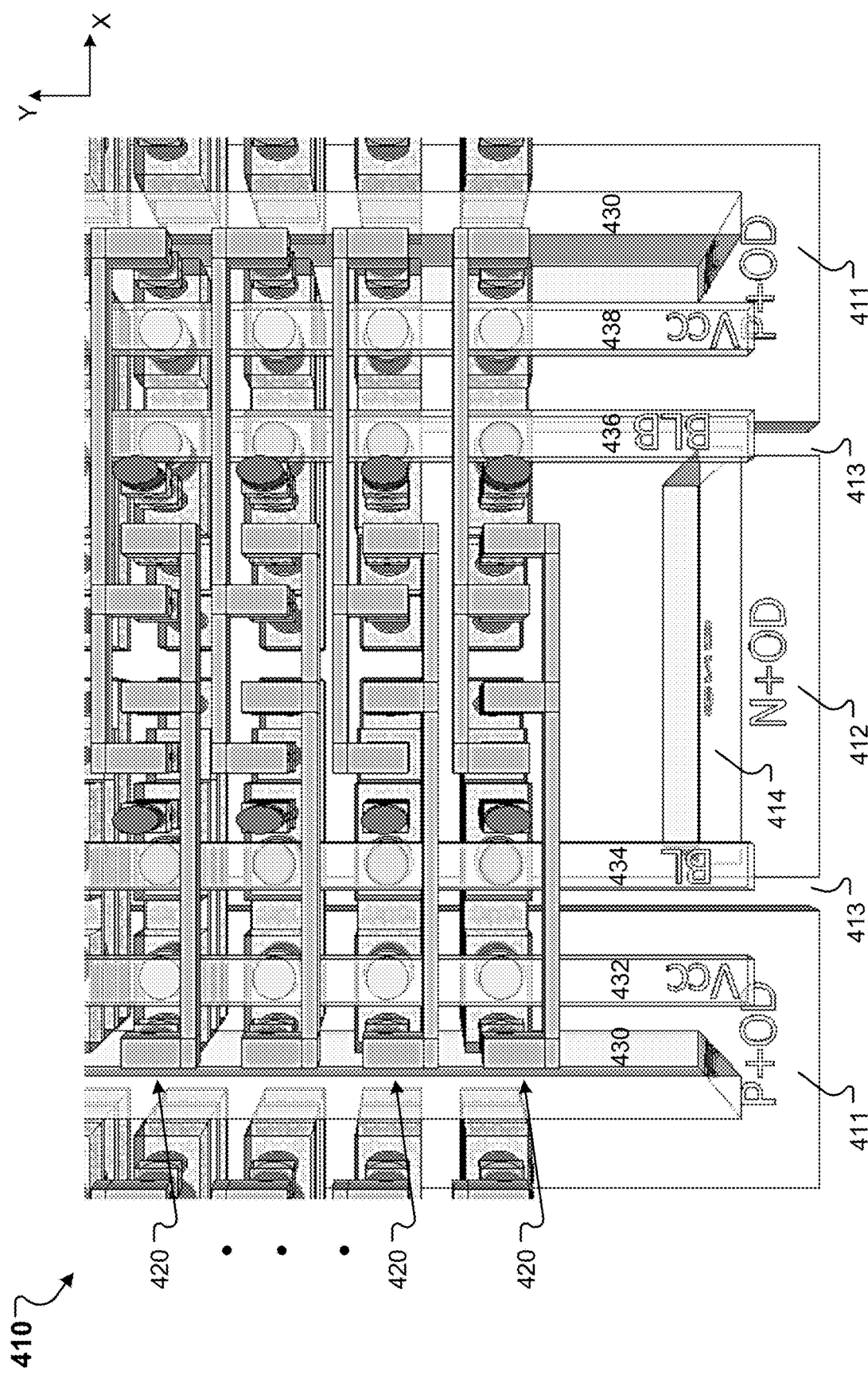

FIGS. 3A-3D illustrate an example 3D SRAM cell structure 300. The SRAM cell structure 300 can be implemented as an SRAM cell. The SRAM cell structure 300 corresponds to the circuit 200 in FIG. 2. FIGS. 3A-3B show perspective views of the 3D SRAM cell structure 300. FIG. 3C shows a cross sectional view of the 3D SRAM cell structure 300. FIG. 3D shows a top view of the 3D SRAM cell structure 300.

Similar to the circuit 200 in FIG. 2, the SRAM cell structure 300 includes a pair of inverters including a first inverter 302 and a second inverter 304. The first inverter 302 includes a pass gate transistor M1 332 (e.g., the transistor M1 212 of FIG. 2), a pull up transistor M2 334 (e.g., the transistor M2 214 of FIG. 2), and a pull down transistor M3 352 (e.g., the transistor M3 216 of FIG. 2). The second inverter 304 includes a pass gate transistor M6 338 (e.g., the transistor M6 226 of FIG. 2), a pull up transistor M4 336 (e.g., the transistor M4 222 of FIG. 2), and a pull down transistor M5 358 (e.g., the transistor M5 224 of FIG. 2). In some examples, the transistors M1, M3, M5, M6 are N-type transistors, e.g., NMOS transistors, while the transistors M2, M4 are P-type transistors, e.g., PMOS transistors.

As an NMOS transistor can achieve a higher current than a PMOS transistor, there may be a mismatch between the NMOS transistor and the PMOS transistor, e.g., M3 352 and M2 334 or M5 358 and M4 336. As illustrated in FIGS. 3A-3C, the first inverter 302 further includes a second pull up transistor M2 354, and the second inverter 304 further includes a second pull up transistor M4 356. The two pull up transistors (e.g., M2 334 and 354 or M4 336 and 356) can be configured to be connected in parallel to obtain a current two times higher than with a single transistor (e.g., M2 or M4). In such a way, a mismatch between the NMOS transistor and the PMOS transistor can be reduced or minimized.

The two inverters 302, 304 are cross-coupled with conductive nodes N0 and N1 (e.g., the nodes N0 and N1 of FIG. 2). For example, as illustrated in FIG. 3C, the node N0 in the first inverter 302 is coupled to a node C1 (e.g., the node C1 of FIG. 2) in the second inverter 304 through a conductive routing line 314, while the node N1 in the second inverter 304 is coupled to a node C0 (e.g., the node C0 of FIG. 2) in the first inverter 302 through a conductive routing line 312.

In some implementations, source terminals of the pass gate transistors M1 332, M6 338 are configured to be coupled to a pair of bit lines BL and BLB, respectively. Gate terminals of the pass gate transistors M1 332, M6 338 can be configured to be respectively coupled to word lines (WLs) that can be a same word line, e.g., as illustrated in FIGS. 4A-4B. Drain terminals of transistors M1 332, M2 334, 354, M3 352 are coupled to the node N0. Source terminals of pull up transistors M2 334, 354, M4 336, 356 are coupled to a supply voltage $V_{CC}$ or $V_{CS}$. Source terminals of pull down transistors M3 352, M5 358 are coupled to a ground (e.g., as illustrated in FIG. 3C or FIG. 4B). Pull up transistor M2 354 and pull down transistor M3 352 share a same gate terminal 353. Pull up transistor M4 356 and pull down transistor M5 358 share a same gate terminal 357.

As FIGS. 3A-3C show, the SRAM cell structure 300 can be formed as a vertical stack of layers 330, 340, 350 sequentially arranged on a substrate 360, e.g., along Z direction. The stacked layers 330, 340, 350 can be conductive layers that can each include conductive materials 331, 341, 351. The conductive materials 331 and 351 can be same as or different from the conductive material 341. In some examples, the conductive materials 331 and 351 are made of Tungsten (W), and the conductive material 341 is made of Titanium (Ti). The stacked layers 330, 340, 350 can be conductively insulated from each other by an insulating layer made of an insulating material 303, e.g., a dielectric material such as silicon oxide (or simplified as oxide or OX). The inverters 302 and 304 can be also separated by the insulating material 303.

The substrate 360 can include any underlying material or materials upon which a device, a circuit, an epitaxial layer, or a semiconductor may be formed. The substrate 360 can include layers that underlie a semiconductor device or even forms a base layer of a semiconductor device. The substrate 360 can include one or any combination of silicon, doped silicon, germanium, silicon germanium, semiconductor compounds, or other semiconductor materials. In some examples, as illustrated in FIG. 3C, the substrate 360 includes three doped (or implanted) regions, two P+ regions 362 and N+ region 364 therebetween, e.g., along X direction. The adjacent doped regions are conductively insulated by a shallow trench insulation (STI) 363 made of an insulating material, e.g., oxide.

The SRAM cell structure 300 can be formed between two adjacent conductive slits 301, e.g., along X direction. That is, adjacent SRAM cells are separated by a slit 301. The conductive slit 301 can vertically (e.g., along Z direction) penetrate through the multiple layers onto the substrate 360, e.g., on the P+ region 362. The slits 301 are conductively coupled to a power supply, e.g., supply voltage Vcc. P-type transistors M2 334, 354, M4 336, 356 can be conductively coupled to the slits 301 to receive the supply voltage Vcc, e.g., at the source terminals. The transistors M1 to M6 formed in the SRAM cell structure 300 are insulated from the slits 301 by the insulating material 303.

The SRAM cell structure 300 includes multiple semiconductor pillars, e.g., 313a, 313b, 313c, 313d (referred to generally as semiconductor pillars 313 and individually as semiconductor pillar 313), vertically penetrating through the vertical stack of layers 330, 340, 350 onto the substrate 360. The pillars 313 can be filled with a semiconductor material, e.g., polysilicon or silicon made of epitaxial growth (or epi Si). In some embodiments, the pillars 313a, 313d are separately coupled to the P+ regions 362 and configured to form P junctions and/or P-type transistors M2 334, 354. The pillars 313b, 313c are coupled to the N+ region 364 and configured to form N junctions and/or N-type transistors M1 332, M3 352, M6 338, and M5 358.

As illustrated in FIG. 3C, each pillar 313 is surrounded by a gate dielectric structure 333 (e.g., gate oxide (GOX)) in the conductive layers 330, 350 and by a gate metallic structure 343 (e.g., silicide or germanide) in the conductive layer 340. In some embodiments, the conductive layer 340 includes a first portion configured to be the N0 node in the first inverter 302 and a second portion configured to be the N1 node in the second inverter 304. The first portion and the second portion of the conductive layer 340 are separated and insulated from each other by the insulating material 303.

Figure 5A:
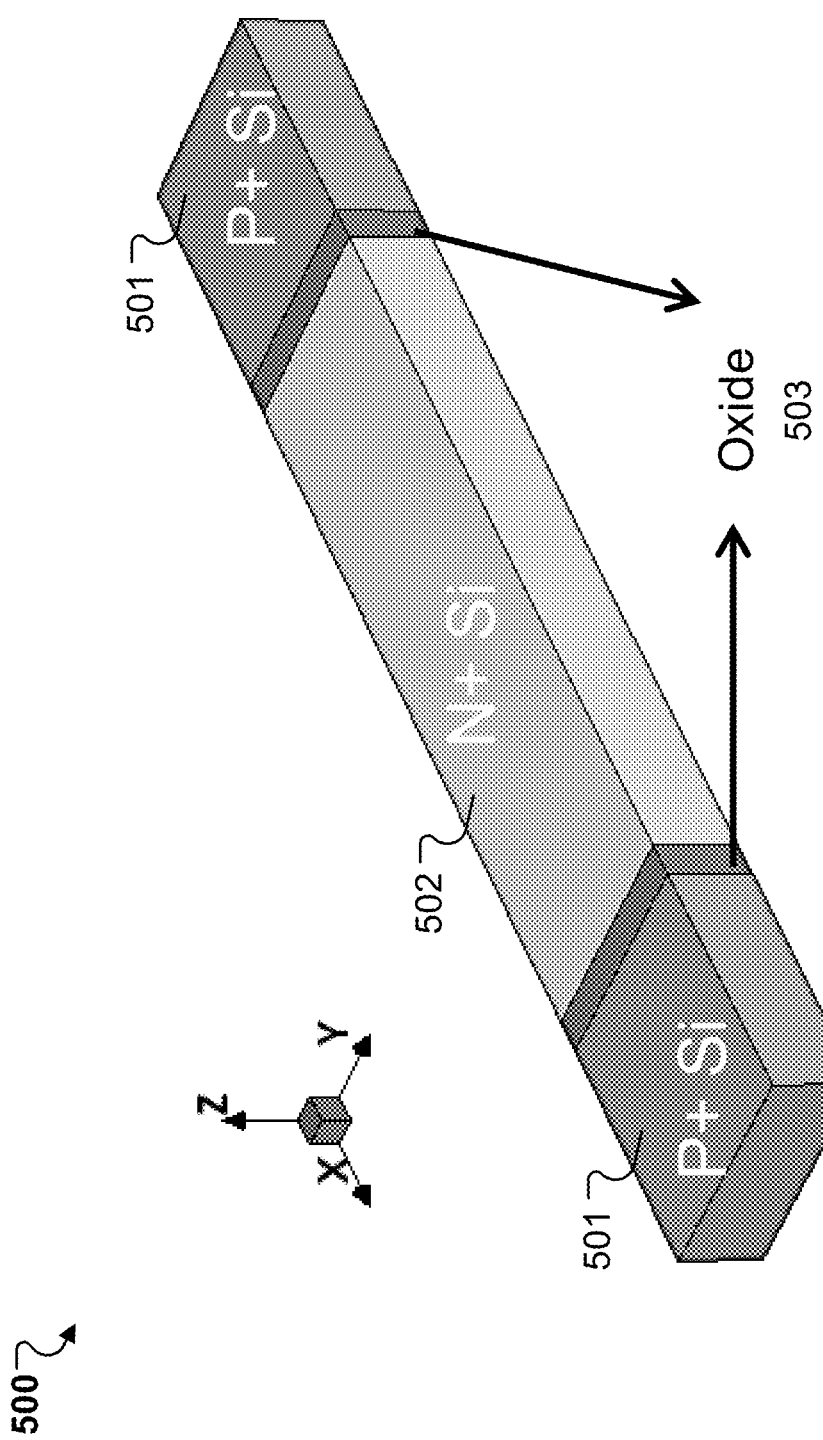
FIGS. 5A-5N illustrate example steps of a process for fabricating a 3D SRAM cell structure.
Figure 5B:
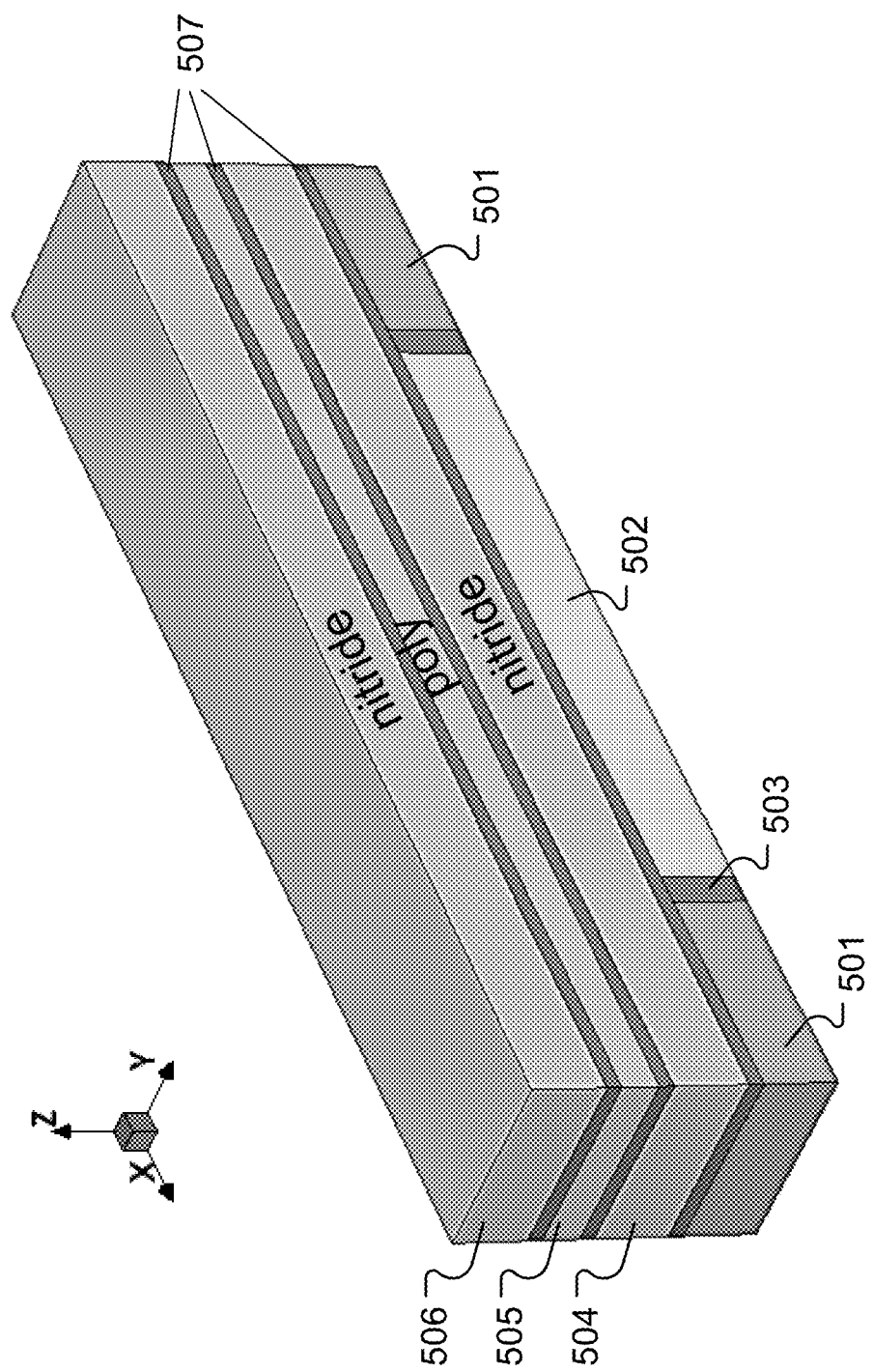
Figure 5C:
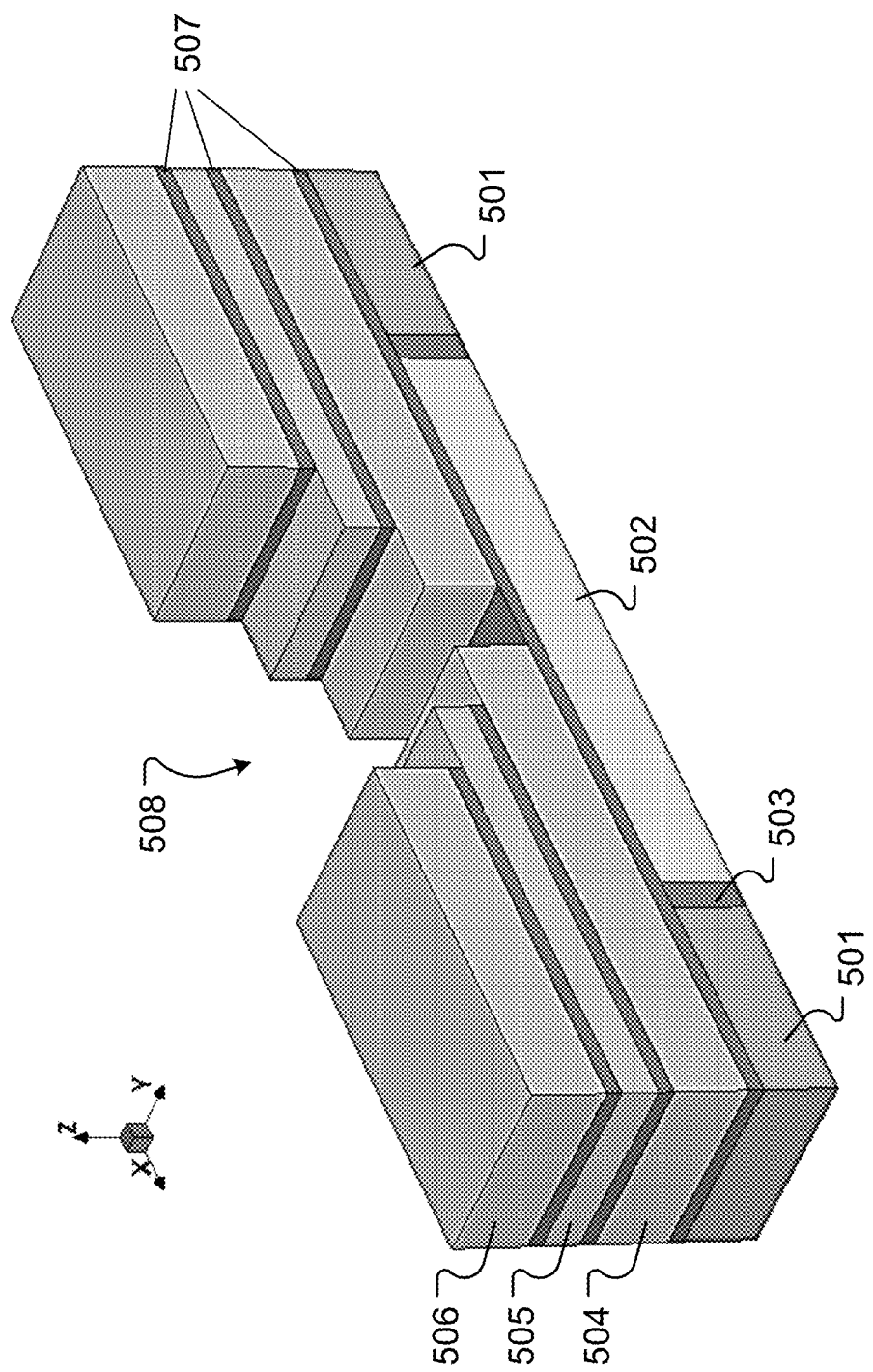
Figure 5D:
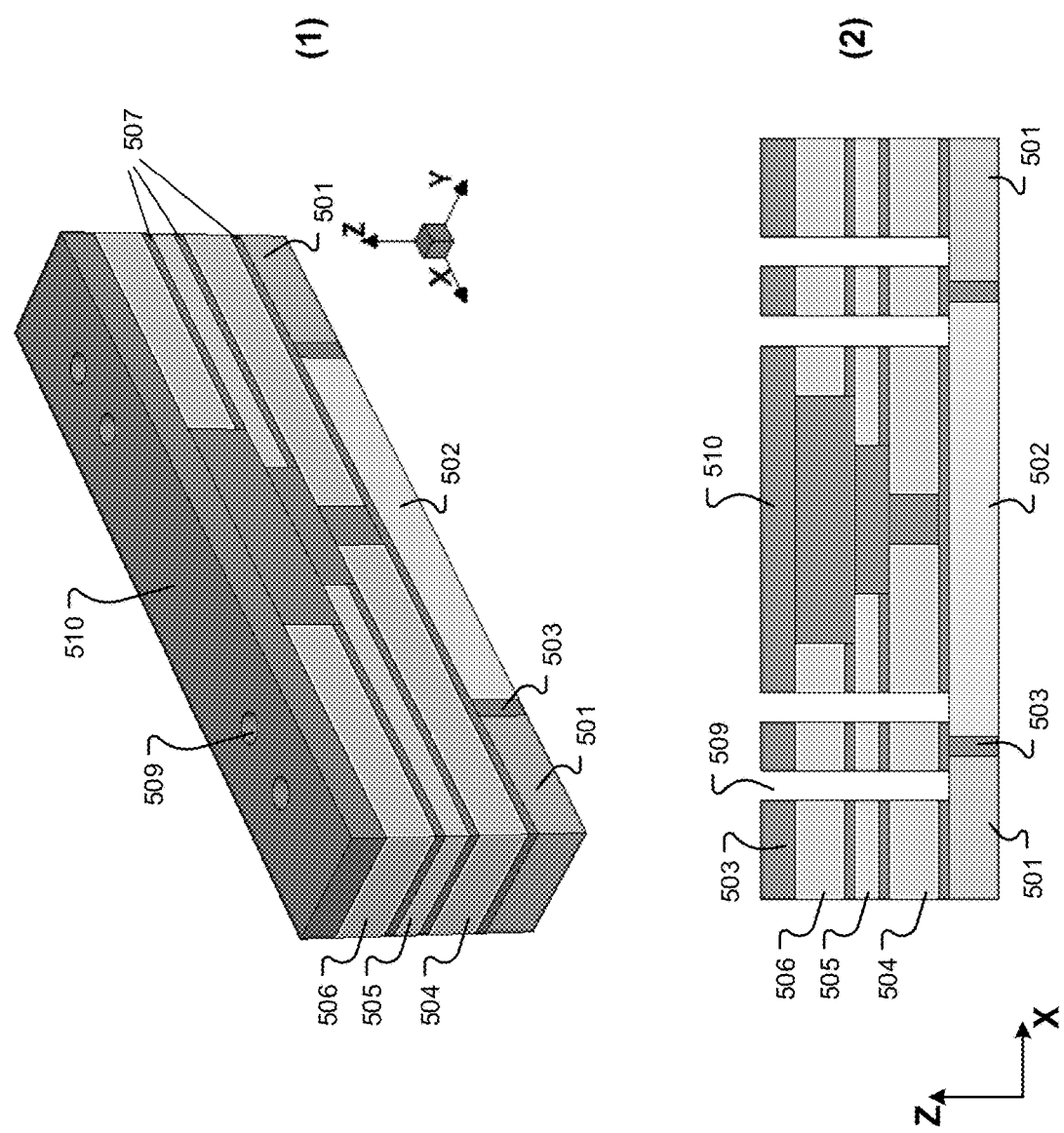
Figure 5E:
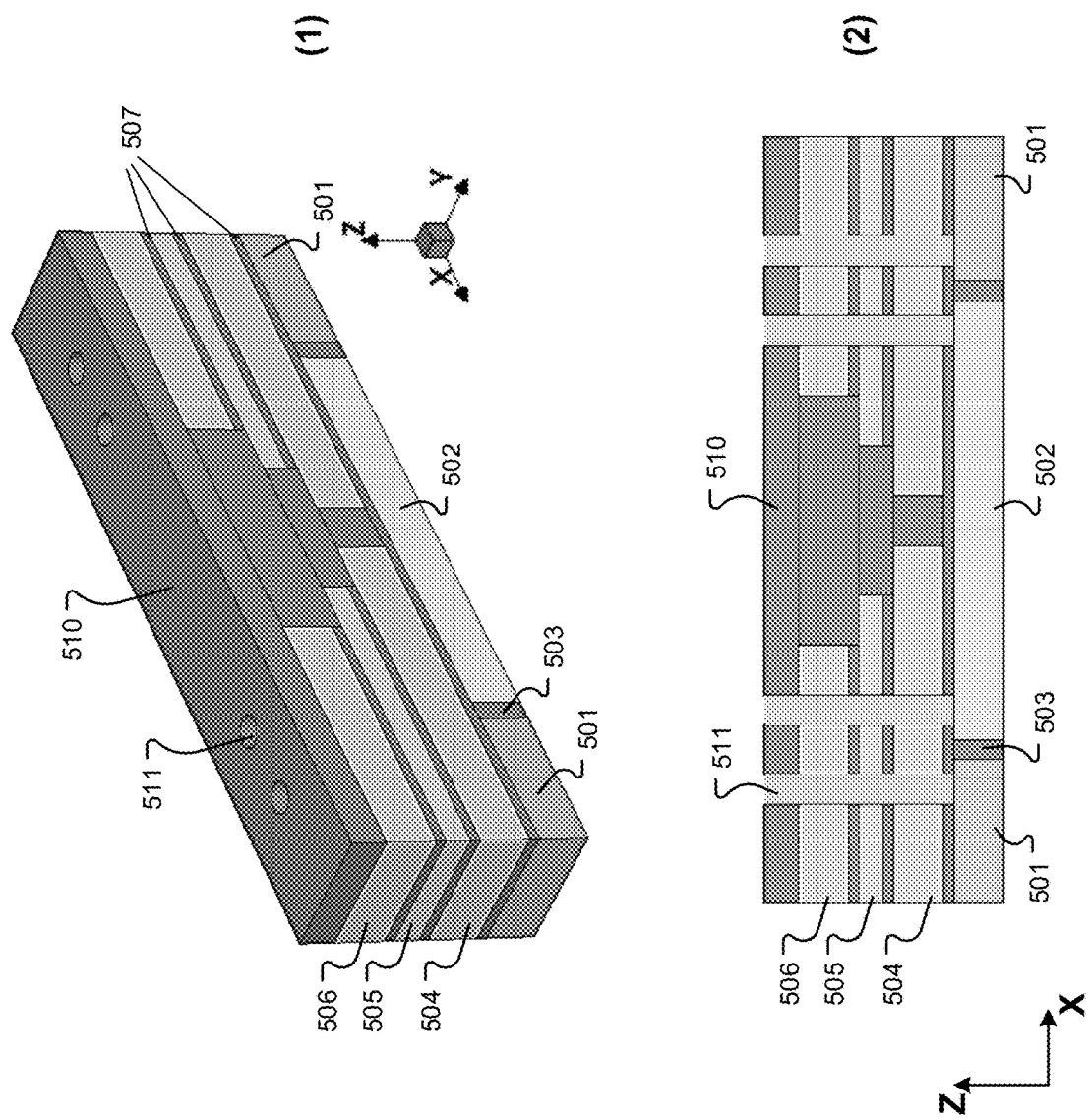
Figure 5F:
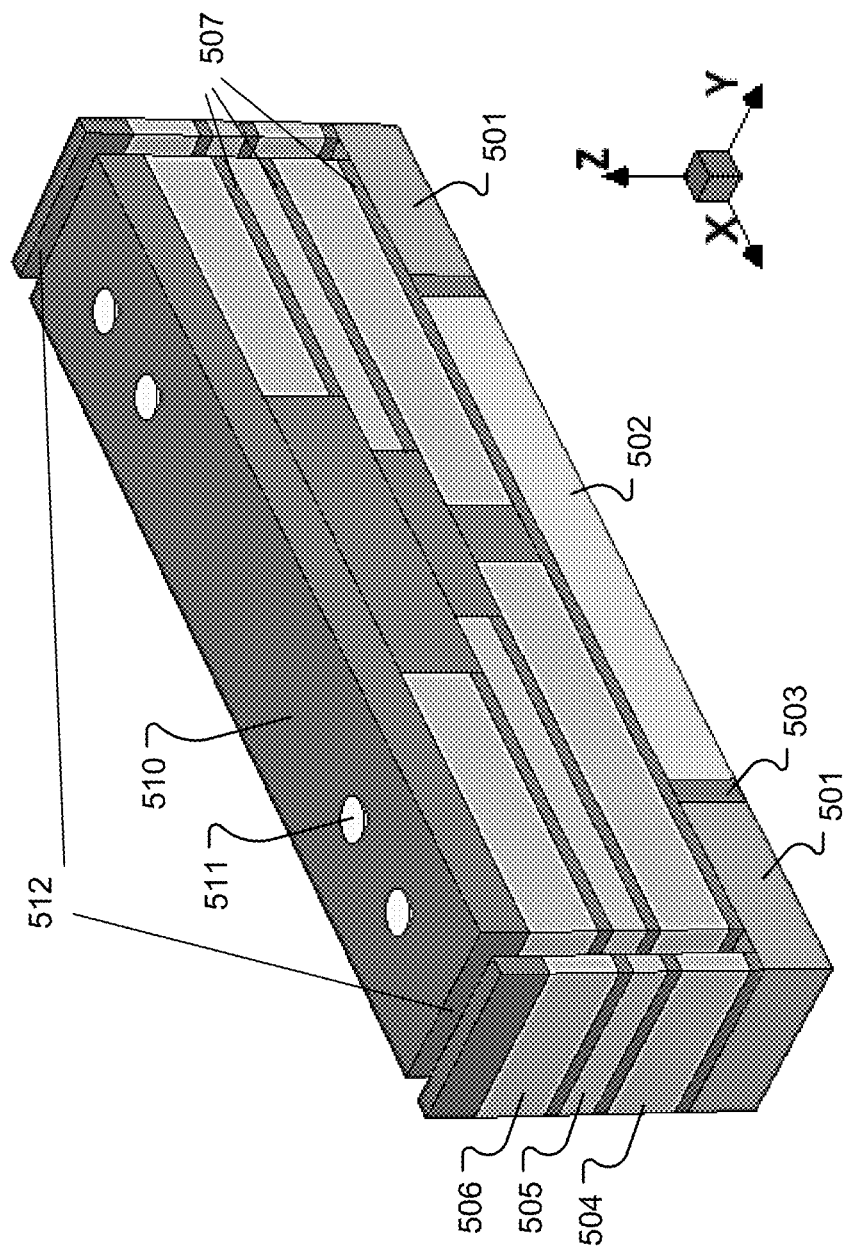
Figure 5G:
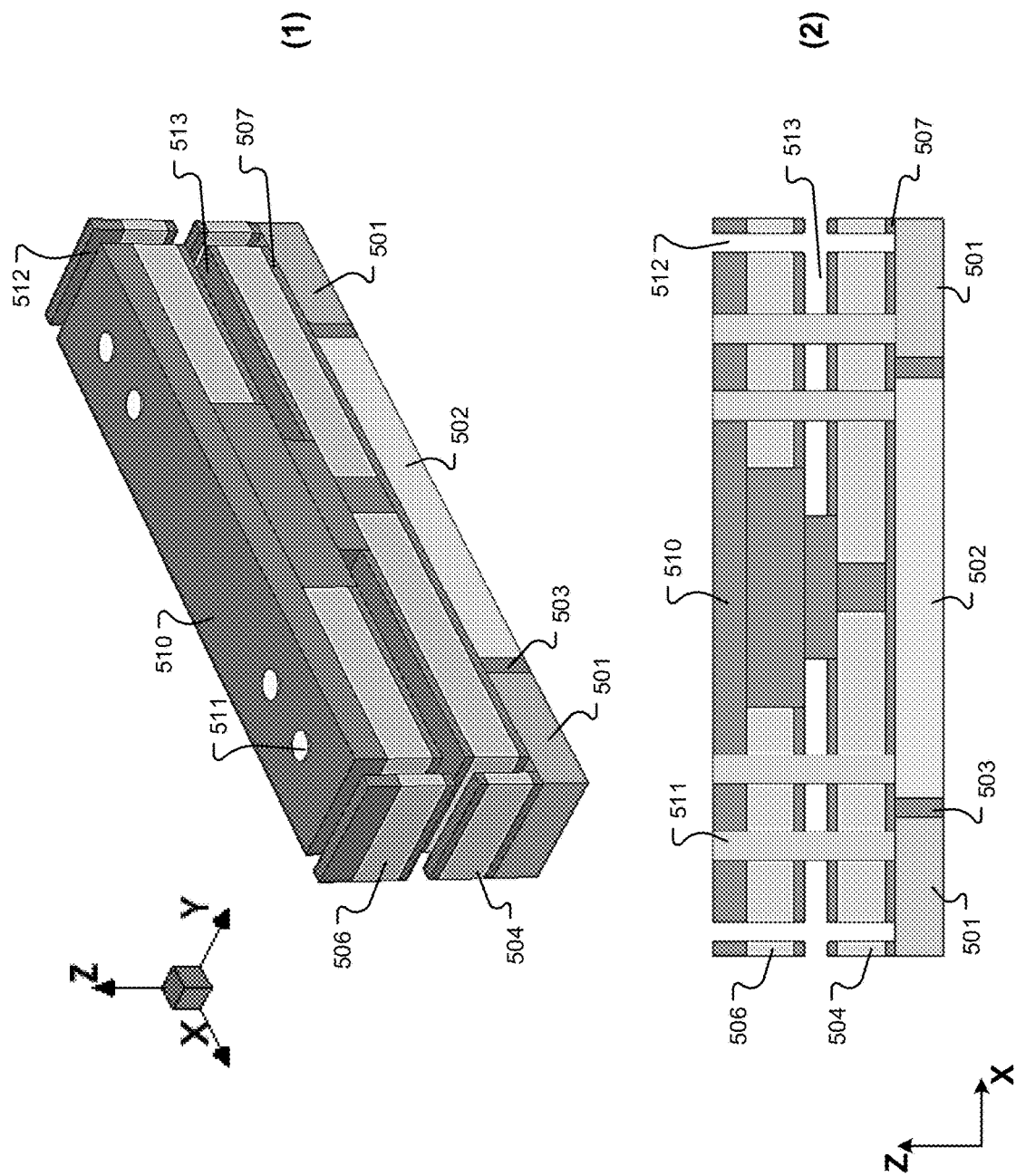
Figure 5H:
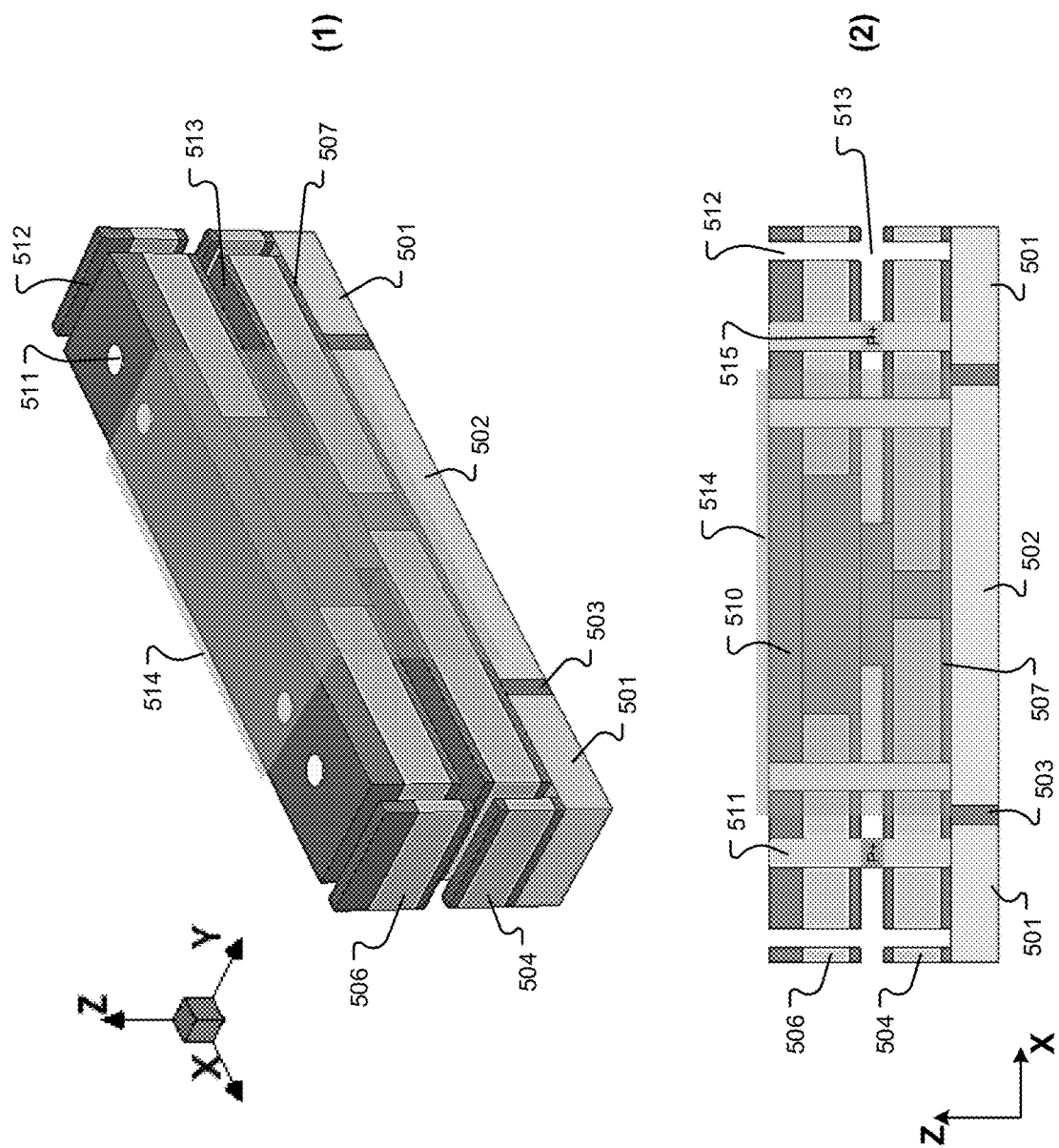
Figure 5I:
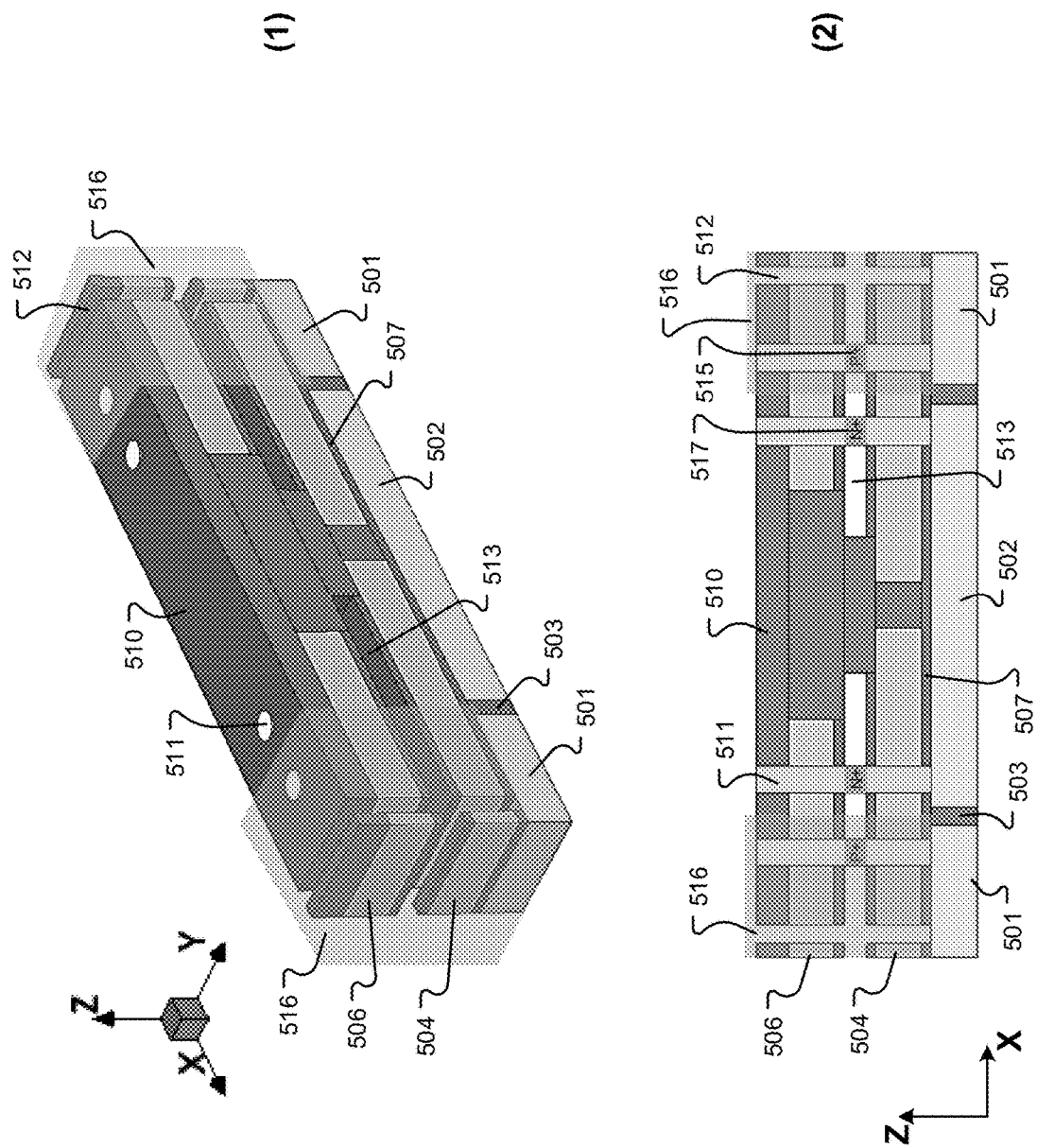

The pillar 313a, 313d includes a middle portion in the conductive layer 340 that is configured to be P junction that can be made of P dopant type material, e.g., as illustrated in FIG. 5H. The pillar 313a, 313d further includes a top portion 322 above the conductive layer 330. The top portion 322 is configured to be P junction that can be made of P dopant type material, e.g., as illustrated in FIG. 5N. Similarly, the pillar 313b, 313c includes a middle portion in the conductive layer 340, and the middle portion is configured to be N junction that can be made of N dopant type material, e.g., as illustrated in FIG. 5I. The pillar 313b, 313c further includes a top portion 324 above the conductive layer 330, and the top portion 324 is configured to be N junction that can be made of N dopant type material, e.g., as illustrated in FIG. 5N. As noted above, the N junctions are configured to form N-type transistors M1, M3, M5, M6, and the P junctions are configured to form P-type transistors M2, M4. In the conductive layer 330, the P-type transistors M2, M4 are insulated from the N-type transistors M1, M6 by the insulating material 303. In the conductive layer 350, the P-type transistor M2 and the N-type transistor M3 share a same gate terminal 353, and the P-type transistor M4 and the N-type transistor share a same gate terminal 357. The gate terminals 353 and 357 can be made of the conductive material, e.g., metal W.

As illustrated in FIGS. 3A, 3B and 3D (and further in FIG. 4C), components in the SRAM cell structure 300 are conductively connected by VIAs (or through holes) 311a to 311h (referred to generally as VIAs 311 and individually as VIA 311) that are connected by different metal layers ML1 320, ML2 310 above the vertical stack of layers 330, 340, 350.

As noted above, the two inverters 302, 304 are cross-coupled with the nodes N0 and N1. The N1 node in the second inverter 304 is conductively coupled to the node C0, the gate terminal of N-type transistor M3 352, and the gate terminal of P-type transistor M2 334, 354 in the first inverter 302 by the corresponding VIAs 311f, 311d, and 311a that are conductively connected in the ML2 layer 310 with the conductive routing line 312. Similarly, the N0 node in the first inverter 302 is conductively coupled to the node C1, the gate terminal of N-type transistor M5 358, and the gate terminal of P-type transistor M4 336, 356 in the first inverter 302 by the corresponding VIAs 311c, 311e, and 311h that are conductively connected in the ML2 layer 320 with the conductive routing line 314. To facilitate the connections, as illustrated in FIGS. 3A-3C, a staircase region 306 is formed between the inverters 302, 304, where the VIAs 311b, 311c, 311d, 311e, 311f, 311g are formed by vertically penetrating through the insulating material 303 filled in the staircase region 306 to the corresponding layers 330, 340, 350. As illustrated in FIGS. 3A and 3D, the VIAs 311 for the SRAM cell structure 300 can be arranged into a same row, e.g., along X direction.

As illustrated in FIGS. 3A-3C, the inverters 302, 304 are symmetrical to each other, e.g., along a middle line along X direction or a middle layer along XY plane. The stack of conductive layers 330, 340, 350 can form two symmetrical staircase sub-regions in the staircase region 306 respectively for the inverters 302, 304, e.g., along the same middle line or the same middle layer. The VIAs 311b, 311c, 311d are formed in the staircase sub-region for the inverter 302, and the VIAs 311e, 311f, 311g are formed in the staircase sub-region for the inverter 304.

As illustrated in FIG. 3A (and further in FIGS. 4A-4B), the source terminals of the pass gate transistors M1 332 and M6 338 are respectively coupled to a pair of bit lines BL and BLB that are formed in the metal layer ML1 320. Each VIA 311 is conductively insulated in the metal layer ML1 320 and conductively connected to an intermediate conductive pad 321 (e.g., a metal pad) in the metal layer ML1 320. In some embodiments, as illustrated in FIG. 3A (and further in FIGS. 4A-4B), a third metal layer can be formed above the metal layer ML2 310, where a word line (402 in FIGS. 4A-4B) can be coupled to the gate terminals of the pass gate transistors M1 332 and M6 338 in the SRAM cell structure 300. As illustrated in FIGS. 3A-3B, the VIAs 311b, 311g can be conductively insulated from the conductive routing line 312, but can be conductively connected to the metal layer ML2 310 through intermediate conductive pads 323 (e.g., metal pads). A first power line connected to the supply voltage Vcc and/or the bit lines BL and BLB can be formed in the metal layer ML1 320. A second power line connected to the ground Vss can be formed in the metal layer ML2 310 or a metal layer with an orientation different from the metal layer ML1 320. Power lines across the whole SRAM cell structure 300 can be formed in the third metal layer or a higher metal layer.

The SRAM cell structure 300 can be scaled down to small sizes. In some examples, the SRAM cell structure 300 has a length (e.g., along X direction) in an order of 100 nm, e.g., within a range from 100 nm to 1000 nm and a width (e.g., along Y direction) in an order of 10 nm, e.g., within a range from 10 nm to 100 nm. In one example, the SRAM cell structure 300 has a size of 150 nm in length and 40 nm in width and area of 0.006 µm². In another example, the SRAM cell structure 300 has a size of 400 nm in length and 80 nm in width and area of 0.032 µm². Each conductive layer, e.g., 330, 340, 350, can have a thickness (along Z direction) of 20 nm. A space between adjacent conductive layers can be 10 nm. A vertical semiconductor pillar, e.g., 313, can have a diameter of 30 nm. The gate dielectric structure, e.g., 333, can have a thickness (e.g., along X direction) of 1 nm. In some examples, the size or thickness of a component in the SRAM cell structure 300 (e.g., the thickness of the conductive layer 330, 340, 350, or the length and/or the width of the SRAM cell structure 300) can be adjustable within a range of 10% compared to the examples illustrated above.

FIGS. 4A-4C illustrate an example SRAM device 400 using 3D SRAM cells 420. The 3D SRAM cell 420 can have a structure same as (or substantially similar to) the SRAM cell structure 300 of FIGS. 3A-3D.

As illustrated in FIG. 4A, the SRAM device 400 includes an array of the 3D SRAM cells 420 arranged along X and Y directions. Along the X direction, the SRAM device 400 can include multiple sections 410-1, 410-2, 410-3 (referred to generally as sections 410 and individually as section 410). As illustrated in FIGS. 4B and 4C, each section 410 includes a plurality of 3D SRAM cells 420 arranged along Y direction.

A section 410 can be formed on a substrate 401 (e.g., the substrate 360 of FIG. 3C). The substrate 401 can include P-doped regions 411 and N-doped region 412 between the two P-doped regions. STIs 413 (e.g., STI 363 of FIG. 3C) can be formed between the P-doped region 411 and the N-doped region 412. These doped regions can extend along the Y direction for the SRAM cells 420 in the section 410. The N-doped region 412 is coupled to a ground 414 deposited on the N-doped region 412. The substrates 401 for the multiple sections 410 can be a single substrate or an integrated substrate.

As noted above, e.g., as illustrated in FIGS. 3A-3C, pass gate transistors M1, M6 in an SRAM cell 420 are configured to be coupled to a corresponding word line 402. The SRAM device 400 includes a plurality of word lines 402 extending along X direction and sequentially arranged along Y direction. Each word line 402 can be coupled to corresponding SRAM cells 420 in the multiple sections 410. Each section 410 is defined between two adjacent conductive slits 430. The conductive slits 430 are formed on the P-doped regions 411, together with semiconductor pillars with P junctions, e.g., 313a, 313d of FIGS. 3C, while semiconductor pillars with N junctions, e.g., 313b, 313c of FIG. 3C, are formed on the N-doped region 412.

The SRAM device 400 can include three metal layers vertically stacked above the SRAM cells 420. A first metal layer, e.g., ML1 layer 320 of FIGS. 3A-3B, is formed above the SRAM cells 420, where bit lines BL 434, BLB 436 are formed extending along Y direction and sequentially arranged along X direction. In some embodiments, supply voltage lines 432, 438 can be formed in the first metal layer and coupled to source terminals of pull-up transistors M2, M4 in the SRAM cells 420. The supply voltage lines 432, 438 can be coupled to the slits 430 by conductive lines 431, such that they can provide a supply voltage Vcc. A second metal layer, e.g., ML2 layer 310 of FIGS. 3A-3B, can be formed above the first metal layer and configured to cross-couple two inverters in the SRAM cells 420, e.g., as illustrated in FIGS. 3A, 3C, and 3D. A third metal layer can be formed above the second metal layer and configured to form the plurality of word lines 402. In some examples, power supply lines Vcc and Vss (e.g., ground) can be also formed in the third metal layer.

FIGS. 5A-5N illustrate an example of steps of a process for fabricating a 3D SRAM cell structure, e.g., the SRAM cell structure 300 of FIGS. 3A-3D or the SRAM cell 420 of FIGS. 4A-4C. The process can be implemented with CMOS technologies. For illustration, some figures include a top diagram (1) and a bottom diagram (2), where the top diagram (1) shows a perspective view of a formed structure after a processing step and the bottom diagram (2) shows a cross-sectional view of the formed structure after the processing step.

FIG. 5A shows a substrate 500 for forming the 3D SRAM cell structure. The substrate 500 can be the substrate 360 of FIG. 3C or the substrate 401 of FIG. 4B. For illustrate, the substrate 500 is made of silicon. The substrate 500 is doped (or implanted) to form three doped (or implanted) regions, two P+ Si regions 501 (e.g., the P+ regions 362 of FIG. 3C or 411 of FIGS. 4B-4C) and N+ Si region 502 (e.g., the N+ region 364 of FIG. 3C or 412 of FIGS. 4B-4C) therebetween, e.g., along X direction. The adjacent doped regions 501, 502 are conductively insulated by a shallow trench insulation (STI) 503 (e.g., the STI 363 of FIG. 3C) made of an insulating material, e.g., oxide. In some examples, the substrate 500 has a length of 400 nm along X direction and 80 nm along Y direction.

FIG. 5B shows three semiconductor layers vertically stacked above the substrate 500, e.g., by deposition using Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature. The stacked layers include a bottom layer 504, a middle layer 505, and a top layer 506. The bottom layer 504 and the top layer 506 are both made of a first material, e.g., silicon nitride (SiN or nitride), while the middle layer 505 is made of second material, e.g., polysilicon (or poly). Adjacent layers 504, 505 and 505, 506 are insulated from each other by a corresponding insulating layer 507, e.g., made of insulating material such as oxide. In some examples, along Z direction, each semiconductor layer 504, 505, 506 has a thickness of 20 nm, and the insulating layer 507 has a thickness of 10 nm. In present embodiment for illustration, the first material is silicon nitride, and the second material is polysilicon. In some other embodiments, a different material can be selected for the first material or the second material, and an etching rate of the first material or the second material can be also different.

FIG. 5C shows a staircase region 508 formed to separate the three stacked layers into two parts for forming a pair of inverters (e.g., the inverters 302, 304 of FIGS. 3A-3C) of the SRAM cell structure.

After the staircase region 508 is formed, insulating material, e.g., oxide, is filled into the staircase region 508 and forms an insulating layer 510 above the semiconductor layer 506. Then, as illustrated in FIG. 5D, four vertical holes 509 are formed through the insulating layers 507, 510 and the stacked layers 504, 505, 506 to the substrate 500. Two holes 509 are open to the P-doped regions 501 and two holes 509 are open to the N-doped region 502. The holes 509 can be formed by anisotropic etching along the vertical direction such as the Z direction, e.g., using reactive ion etching (RIE) or plasma etching. In some examples, the hole 509 has a diameter of 30 nm.

FIG. 5E shows semiconductor pillars (or vertical channels) 511 formed by filling a semiconductor material into the vertical holes 509. In some examples, the semiconductor pillars 511 are formed by epitaxial growth of silicon (e.g., epi Si) in the vertical holes 509. In some embodiments, the semiconductor pillars 511 are formed by polysilicon deposition. The middle layer 505 can use a different material from that of the semiconductor pillars 511.

FIG. 5F shows two slits 512 formed to define a single SRAM cell structure. The slits 512 can be formed by etching through the layers above the substrate 500. The slits 512 also provide channels to etch semiconductor layers under the insulating layer 510.

As illustrated in FIG. 5G, the middle layer 505 is selectively etched to remove polysilicon material in the middle layer 505 to form an open space 513, leaving the insulating material such as oxide in the staircase region and the semiconductor pillars 511 in the space 513.

Before filling the open space 513, the semiconductor pillars 511 are treated to separately formed P junctions and N junctions. As illustrated in FIG. 5H, a first mask 514 is used to cover the two middle pillars 511 and middle parts of the left and right pillars 511 that are not covered by the mask 514 are doped into P junctions 515, e.g., by plasma doping.

Then, as illustrated in FIG. 5I, a second mask 516 is formed to cover the left and right pillars 511 that include the P junctions 515, and then middle parts of the two middle pillars 511 that are not covered by the mask 516 are doped into N junctions 517, e.g., by plasma doping.

Figure 5J:
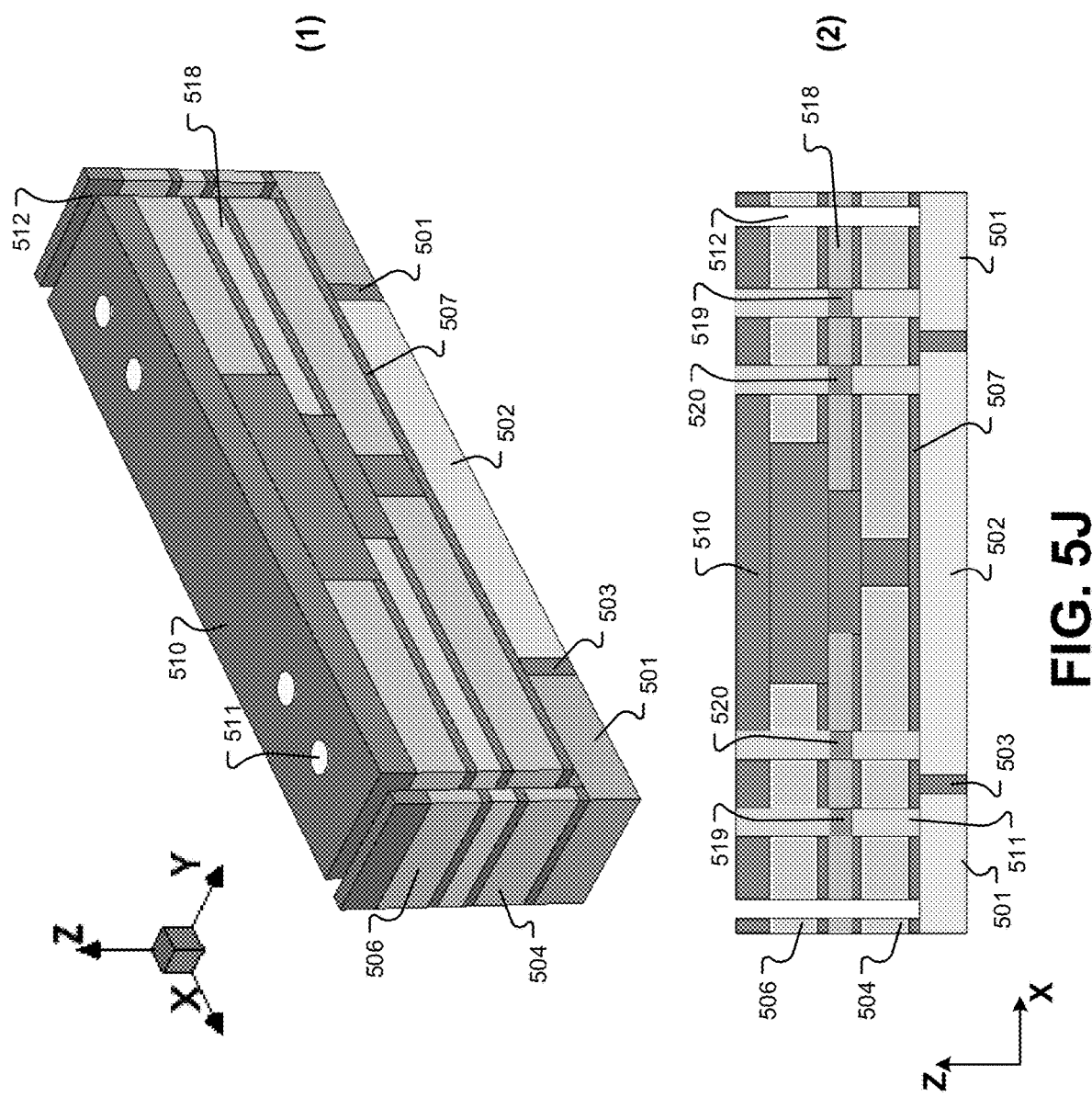

FIG. 5J shows a conductive layer 518 formed by filling a metallic material, e.g., Titanium (Ti), into the open space 513. The conductive layer 518 is separated into two parts by the insulating material in the staircase region, a left part being used as a first node N0 (e.g., the N0 node of FIGS. 3A-3C) and a right part being used as a second node N1 (e.g., the N1 node of FIGS. 3A-3C). The P junctions 515 and N junctions 517 in the semiconductor pillars 511 react with the metallic material and are converted into P junctions 519 and N junctions 520 in the conductive layer 518. For example, the P junctions 515 and N junctions 517 are epi Si, which reacts with the filled metal Ti into TiSi. In some embodiments, before filling the metallic material such as Ti, metallic silicide is grown around the semiconductor pillars 511 in the open space 513, e.g., as illustrated in FIG. 3C.

Figure 5K:
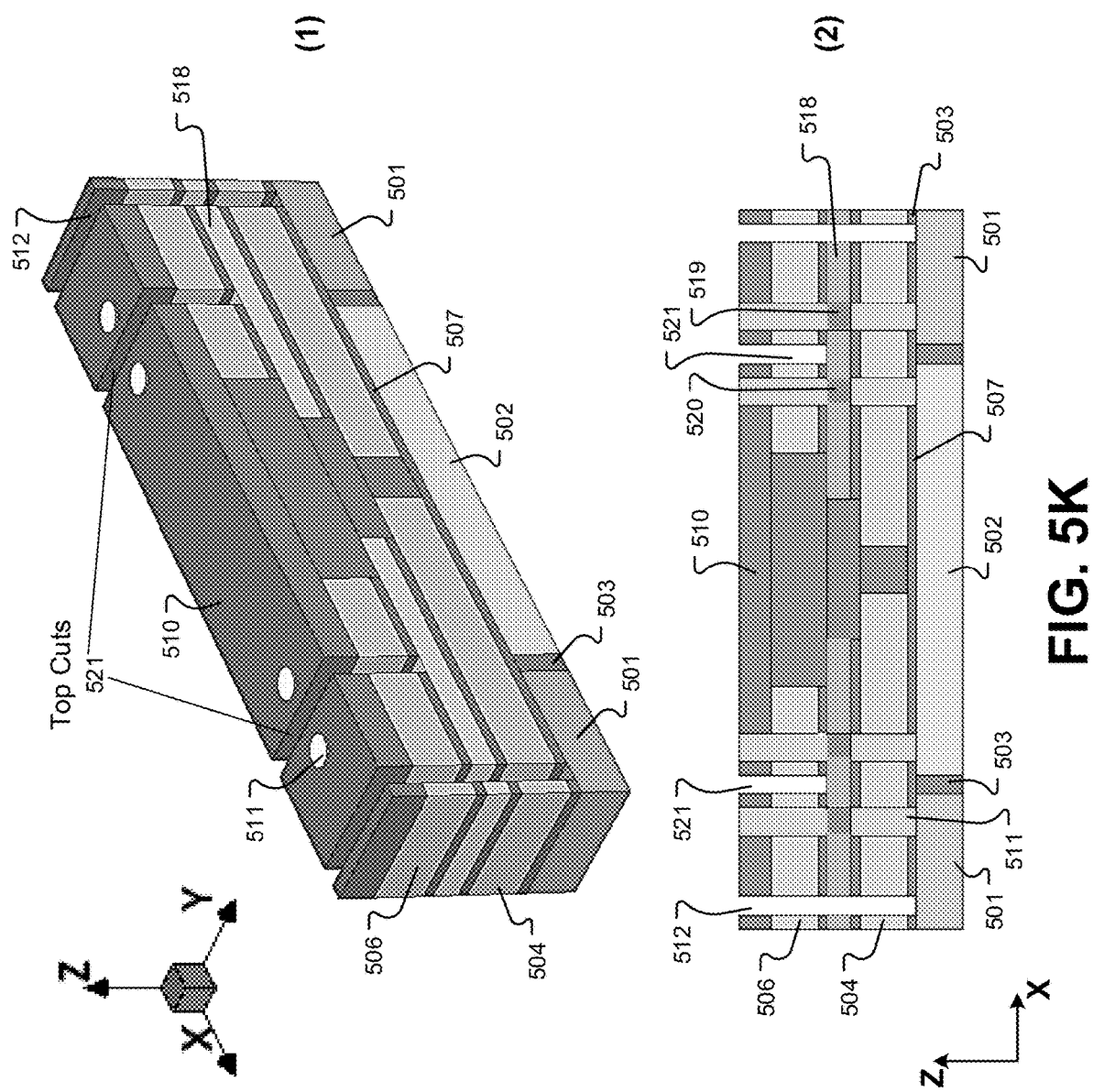
Figure 5L:
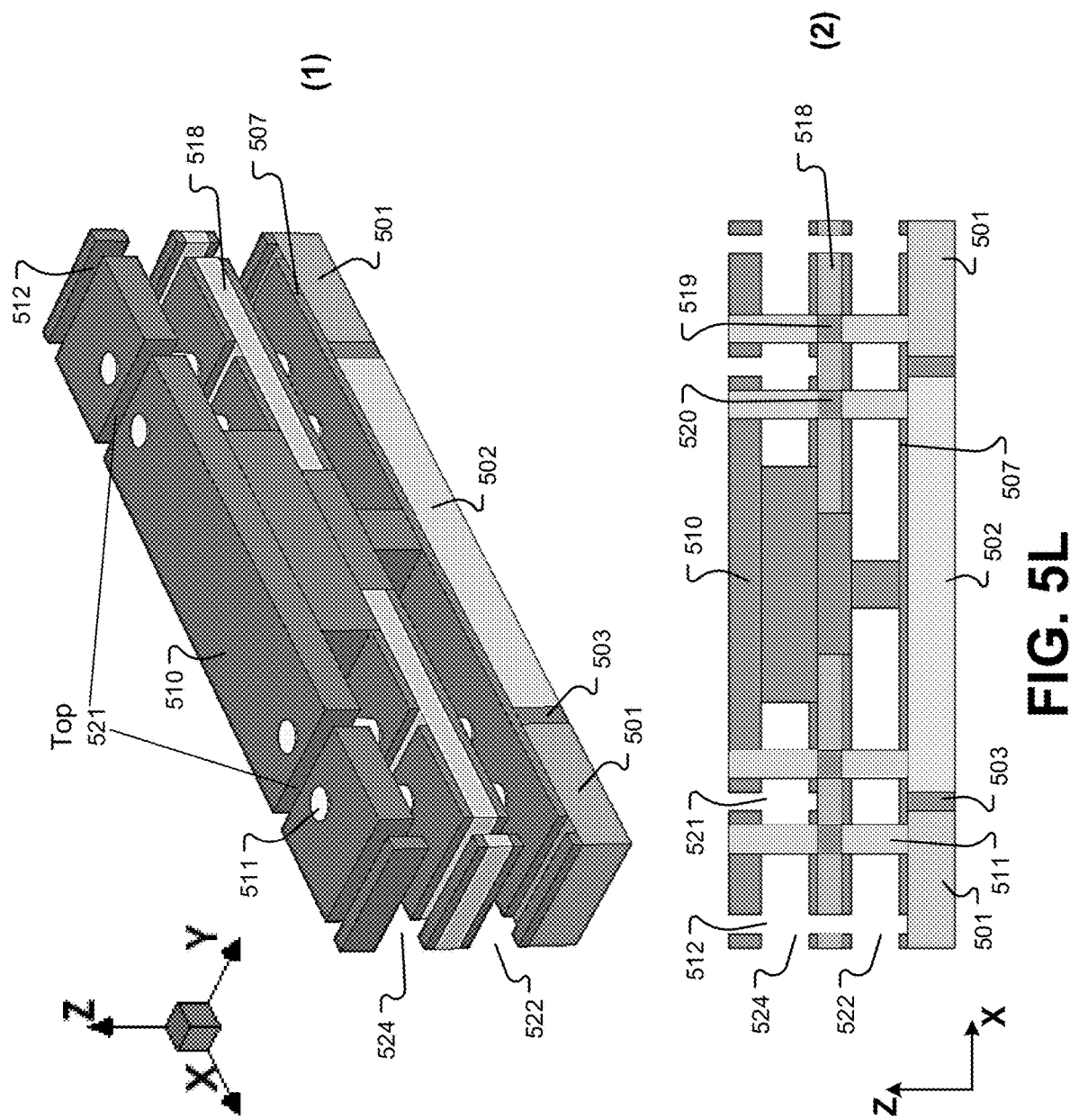

To form different transistors, two cuts 521 are formed by vertically etching the top layers 510, 506, 507 until the conductive layer 518, as illustrated in FIG. 5K. Then, the semiconductor layers 504 and 506 (e.g., made of nitride) are selectively etched away to form open spaces 522 and 524, as illustrated in FIG. 5L.

Figure 5M:
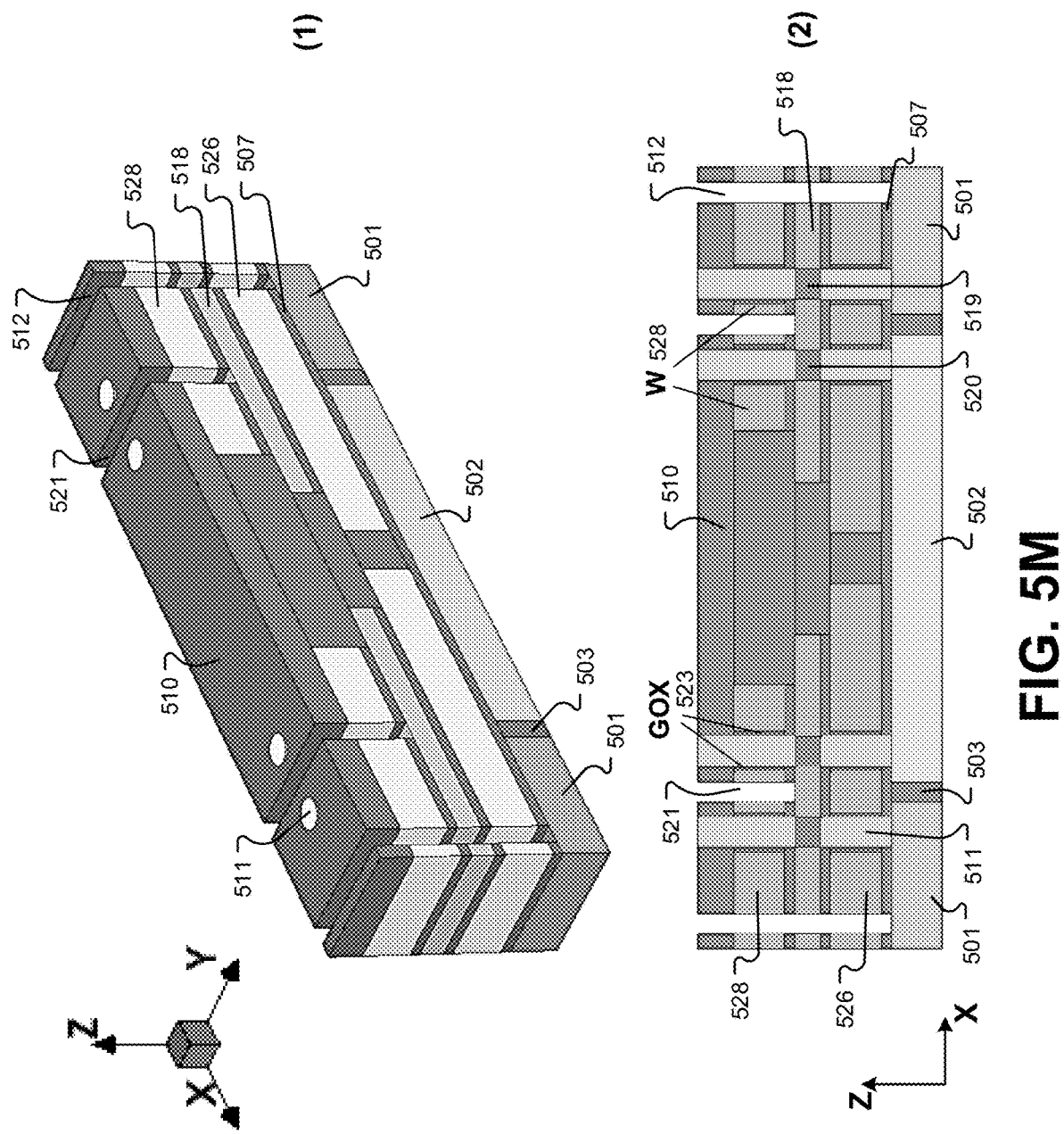
Figure 5N:
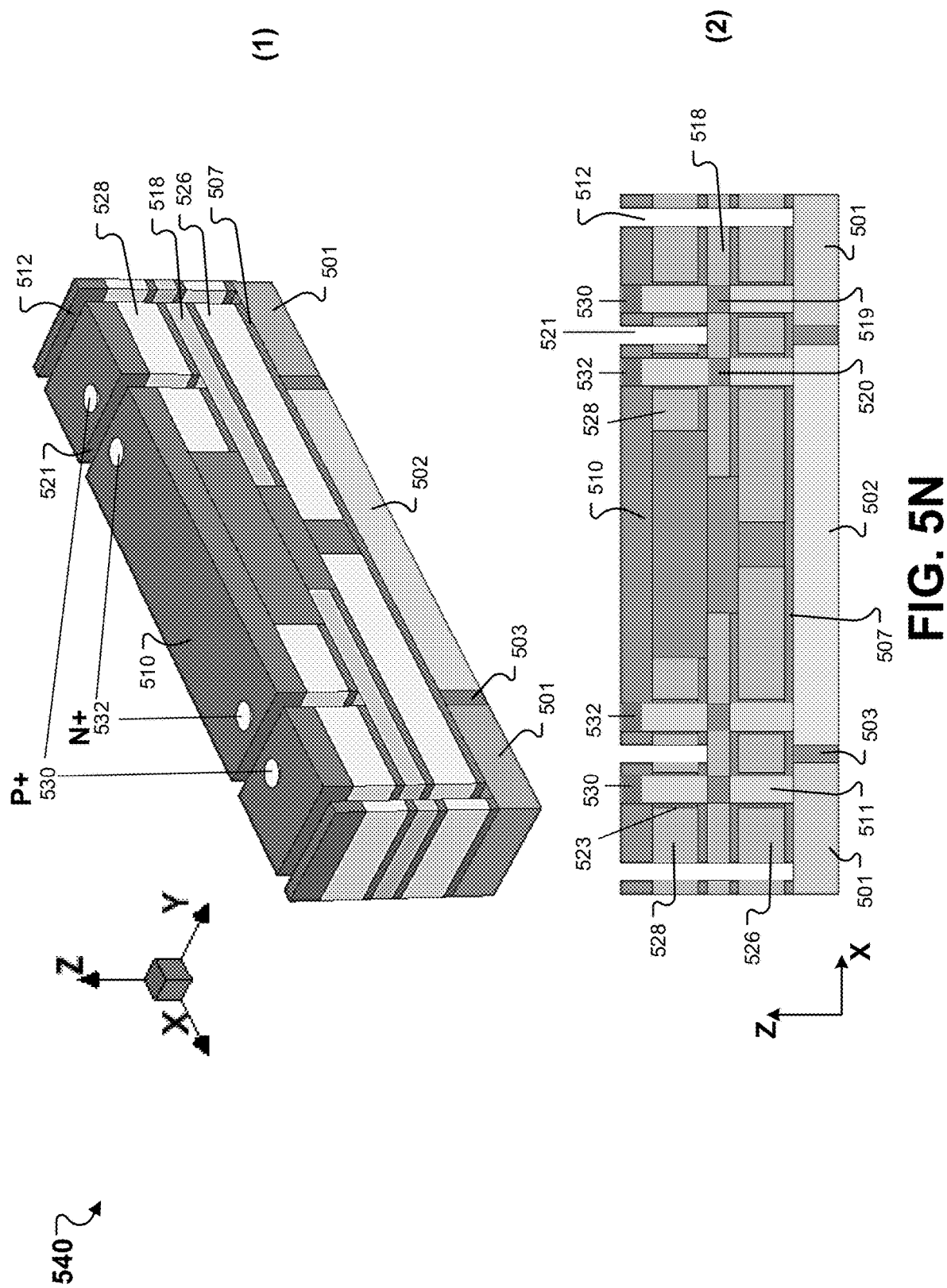

Gate oxide (GOX) material is then grown around the semiconductor pillars 511 in the open spaces 522 and 524 to form a thin GOX layer 523, e.g., as illustrated in FIG. 5M. After that, a conductive material, e.g., metal W, is filled into the open spaces 522 and 524 to form conductive layers 526 and 528 (e.g., the conductive layers 330 and 350), respectively. Then the conductive layers 526 and 528 is etched back to be confined within the spaces 522 and 524. The cuts 521 are kept unchanged, and the GOX layers 523 are surrounded by the conductive material such as W, as illustrated in FIGS. 5M and 3C.

Then, top parts of the semiconductor pillars 511 are doped to form into P+ junctions 530 and N+ junctions 532, respectively. FIG. 5N shows a formed structure 540 as a result of the process steps of FIGS. 5A-5N. Then, insulating material, e.g., oxide, can be filled into the formed structure 540, e.g., into the cuts 521, to form insulating slits, and a conductive material (e.g., metal W) can be deposited into the slits 512 and electrically connect to the P+ Si regions 501 (e.g., to form the slits 301 of FIG. 3C) to get a final structure that can be implemented as an SRAM cell structure.

Post processing steps, e.g., forming VIAs (e.g., the VIAs 311 of FIGS. 3A-3D) and forming metal layers (e.g., ML1 320 and ML2 310 of FIGS. 3A-3B) with conductive routing lines (e.g., 312 and 314 of FIGS. 3A, 3B, 3D), bit lines (e.g., BL 434 and BLB 436 of FIG. 4B), power supply lines (e.g., 432 and 438 of FIG. 4B), and/or word lines (e.g., 402 of FIGS. 4A-4C), can be further performed to form an SRAM device (e.g., the SRAM device 400 of FIGS. 4A-4C) including an array of SRAM cells.

Figure 6:
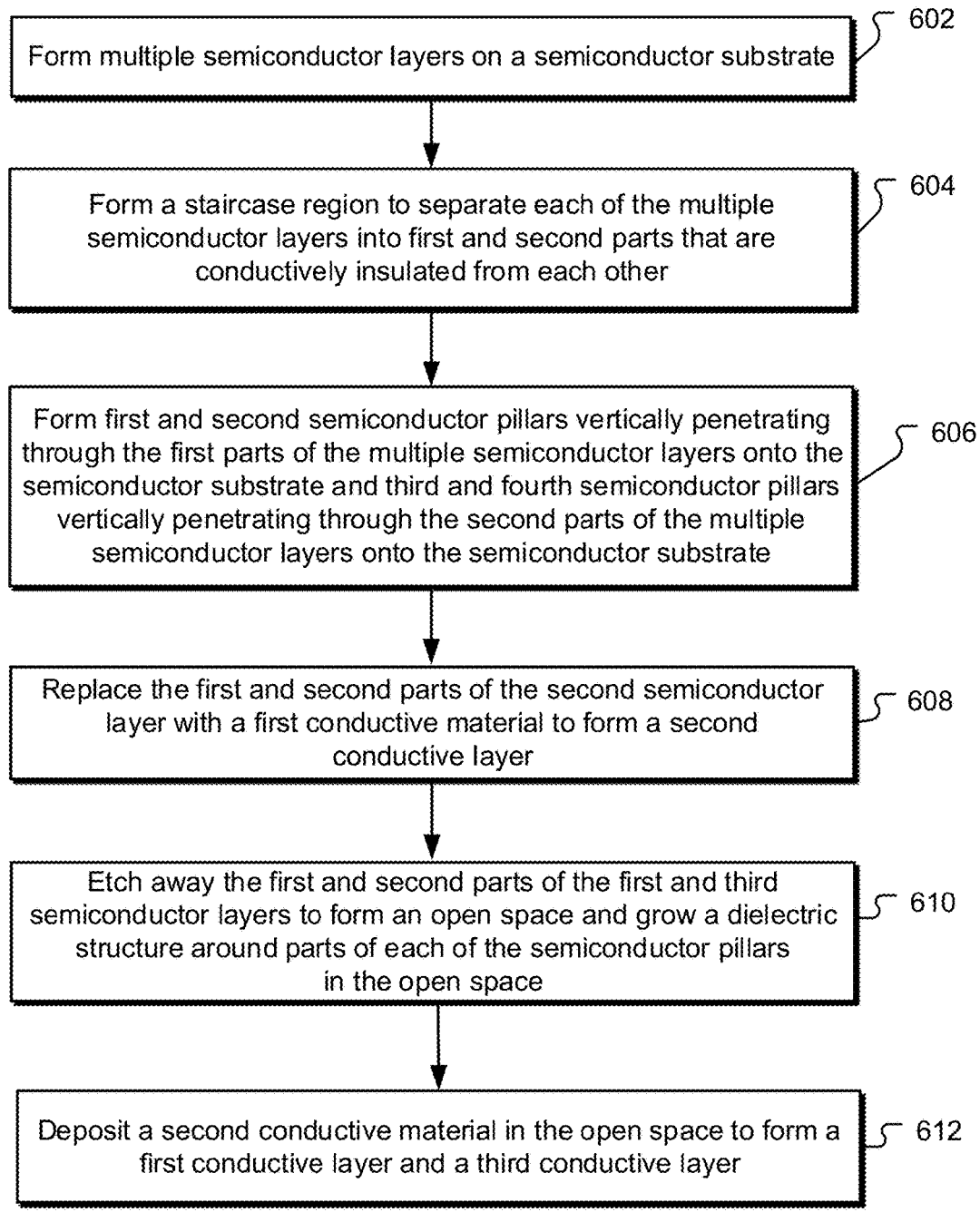
FIG. 6 illustrates a flow chart of an example of a process for forming a 3D SRAM cell structure.

FIG. 6 illustrates a flow chart of an example of a process 600 for forming a 3D semiconductor structure, e.g., the SRAM cell structure 300 as illustrated in FIG. 3A-3D or 420 as illustrated in FIGS. 4A-4C. The process 600 can be similar to the process illustrated in FIGS. 5A-5N.

At 602, multiple semiconductor layers are formed on a semiconductor substrate. The semiconductor substrate can be the substrate 500 of FIG. 5A, the substrate 360 of FIG. 3C, or the substrate 401 of FIG. 4B. The semiconductor substrate 500 can be doped (or implanted) to form a pair of doped regions with a first dopant type (e.g., two P+ Si regions 501 of FIG. 5A) and a second doped region with a second dopant type (e.g., N+ Si region 502 of FIG. 5A). The adjacent doped regions can be conductively insulated, e.g., by a shallow trench insulation such as STI 503 of FIG. 5A.

The multiple semiconductor layers can include first, second, and third semiconductor layers (e.g., 504, 505, 506 of FIG. 5B) that are sequentially stacked together along a vertical direction. The first and third semiconductor layers can be made of a first material, e.g., silicon nitride, while the second semiconductor layer can be made of a second material, e.g., polysilicon. Adjacent semiconductor layers can be insulated from each other by a corresponding insulating layer, e.g., 507 of FIG. 5B. The three semiconductor layers can be vertically stacked above the semiconductor substrate 500, e.g., by deposition using Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature, or any other suitable spin-on deposition methods with a certain temperature.

At 604, a staircase region is formed to separate each of the multiple semiconductor layers into first and second parts that are conductively insulated from each other. As illustrated in FIGS. 5C and 5D, the staircase region can be formed by etching materials between the first and second parts of the multiple semiconductor layers and depositing an insulating material (e.g., oxide) into the etched areas between the first and second parts of the multiple semiconductor layers.

At 606, first and second semiconductor pillars vertically penetrating through the first parts of the multiple semiconductor layers onto the semiconductor substrate are formed and third and fourth semiconductor pillars vertically penetrating through the second parts of the multiple semiconductor layers onto the semiconductor substrate are formed. The first, second, third, and fourth semiconductor pillars are sequentially arranged along a horizontal direction perpendicular to the vertical direction.

As illustrated in FIGS. 5D-5E, four vertical holes (e.g., 509 of FIG. 5D) can be first formed through the multiple semiconductor layers and the insulating layers therebetween to the semiconductor substrate. Two holes are open to the first doped regions (e.g., 501 of FIG. 5D), and two holes are open to the second doped region (e.g., 502 of FIG. 5D). The holes can be formed by anisotropic etching along the vertical direction, e.g., using reactive ion etching (RIE) or plasma etching. Then, the four semiconductor pillars (e.g., 511 of FIG. 5D) can be formed by filling a semiconductor material into the four vertical holes. In some examples, the semiconductor pillars are formed by epitaxial growth of silicon (e.g., epi Si) in the vertical holes. In some embodiments, the semiconductor pillars are formed by polysilicon deposition. The second material of the second semiconductor layer can be different from the semiconductor material of the semiconductor pillars.

At 608, the first and second parts of the second semiconductor layer are replaced with a first conductive material to form a second conductive layer (e.g., 518 of FIG. 5J).

In some embodiments, as illustrated in 5F, two open slits (e.g., 512 of FIG. 5F) can be formed by etching through the multiple semiconductor layers onto the semiconductor substrate, and the first, second, third, and fourth semiconductor pillars are between the two open slits. The two open slits are used to define a single SRAM cell structure. The two open slits can be formed by etching through the multiple semiconductor layers above the semiconductor substrate. The open slits can provide channels to selectively etch the multiple semiconductor layers.

As illustrated in FIG. 5G, the first and second parts of the second semiconductor layer are etched away through the two open slits to obtain a first open space, e.g., 513 of FIG. 5G. Before filling the first open space with the first conductive material to form the second conductive layer, as illustrated in FIG. 5H, first junctions with the first dopant type (e.g., P+ junctions 515 of FIG. 5H) in parts of the first and fourth semiconductor pillars are formed in the first open space; and, as illustrated in FIG. 5I, second junctions with the second dopant type (e.g., N+ junctions 517 of FIG. 5I) in parts of the second and third semiconductor pillars can be formed in the first open space.

Then, as illustrated in FIG. 5J, the second conductive layer (e.g., 518 of FIG. 5J) is formed by filling the first conductive material, e.g., Titanium (Ti), into the first open space. The first junctions (e.g., P junctions 515 of FIG. 5H) and the second junctions (e.g., N junctions 517 of FIG. 5I) in the four semiconductor pillars react with the first conductive material and are converted into new first junctions (e.g., P junctions 519 of FIG. 5J) and new second junctions (e.g., N junctions 520 of FIG. 5J) in the second conductive layer.

At 610, the first and second parts of the first and third semiconductor layers are etched away to form a second open space, and a dielectric structure around parts of each of the semiconductor pillars in the second open space is formed.

To form different transistors, two top slits (e.g., 521 of FIG. 5K) are formed, where a first top slit is formed between the first and second semiconductor pillars and a second top slit is formed between the third and fourth semiconductor pillars. The first top slit and the second top slit extend along the vertical direction through the first semiconductor layer onto the second conductive layer, as illustrated in FIG. 5K. Then, the first and third semiconductor layers are selectively etched away through the open slits and the two top slits to form the second open space (e.g., 522 and 524 as illustrated in FIG. 5L).

As illustrated in FIG. 5M, a dielectric material, e.g., GOX material, can be then grown around the semiconductor pillars in the second open space to form the corresponding dielectric structures, e.g., thin GOX layer 523 of FIG. 5M. The dielectric structures are used as gate dielectric structures, e.g., 333 of FIG. 3C.

At 612, a second conductive material in the open space is deposited to form a first conductive layer and a third conductive layer. The second conductive material can be metal W. The dielectric structures are respectively surrounded by the first, second, third, and fourth semiconductor pillars and the first conductive layer and the third conductive layer.

In some embodiments, the process 600 can further include doping top parts of the semiconductor pillars to form into another first junctions with the first dopant type (e.g., P+ junctions 530 of FIG. 5N) and another second junctions with the second dopant type (e.g., N+ junctions 532 of FIG. 5N), respectively.

In some embodiments, the process 600 further includes depositing an insulating material (e.g., oxide) into the top first and second slits. The process 600 can further include depositing a conductive material (e.g., metal W) into the open slits to get two conductive slits that are electrically connected to the first doped regions. A final structure obtained from the process 600 can be implemented as an SRAM cell structure.

The process 600 can also include one or more post processing steps, e.g., forming VIAs (e.g., the VIAs 311 of FIGS. 3A-3D) and forming metal layers (e.g., ML1 320 and ML2 310 of FIGS. 3A-3B) with conductive routing lines (e.g., 312 and 314 of FIGS. 3A, 3B, 3D), bit lines (e.g., BL 434 and BLB 436 of FIG. 4B), power supply lines (e.g., 432 and 438 of FIG. 4B), and/or word lines (e.g., 402 of FIGS. 4A-4C), can be further performed to form an SRAM device (e.g., the SRAM device 400 of FIGS. 4A-4C) including an array of SRAM cells.

Figure 7:
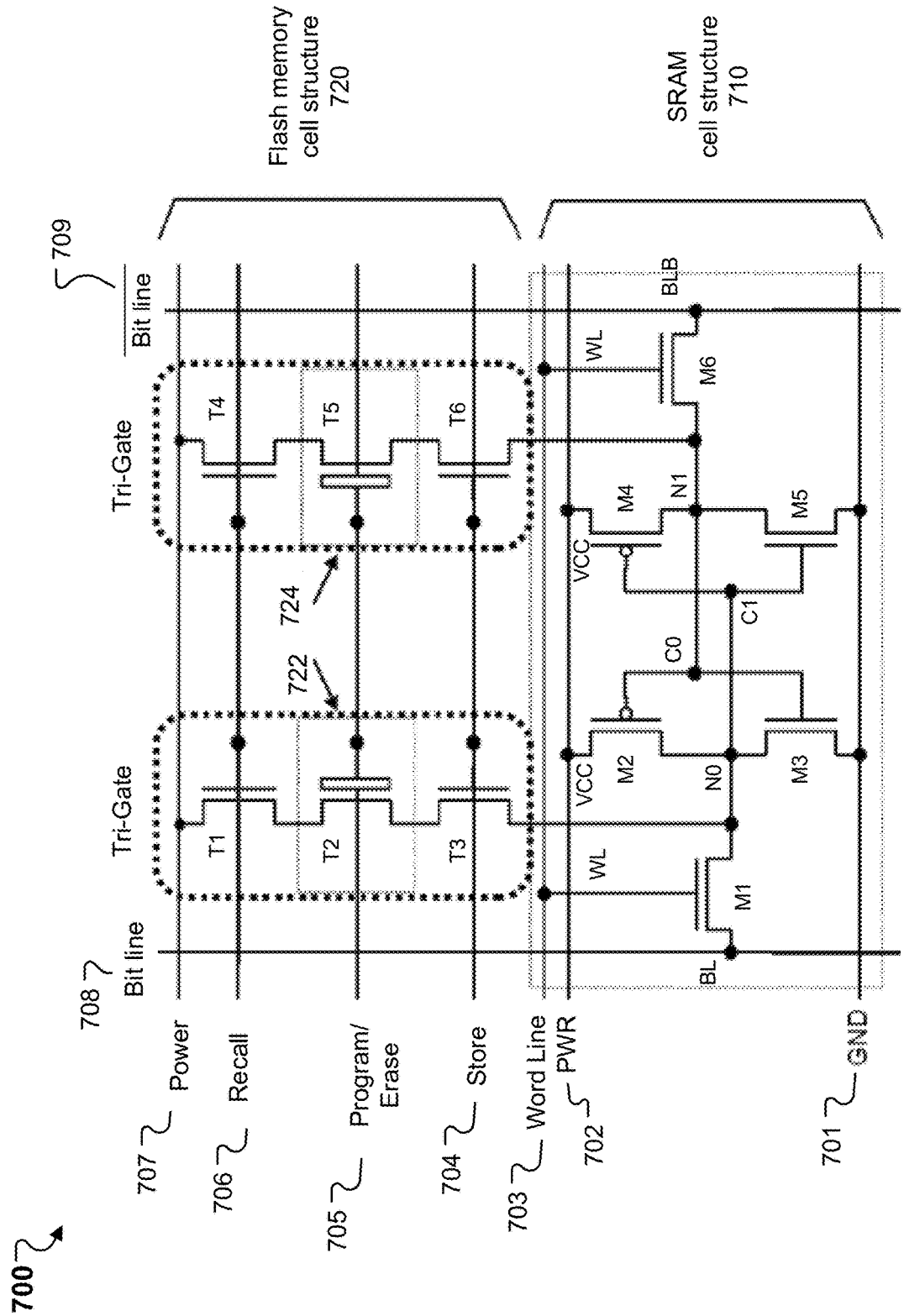
FIG. 7 illustrates a semiconductor device integrating an example SRAM cell structure and an example flash memory cell structure.

FIG. 7 illustrates a semiconductor device 700 integrating an example SRAM cell structure 710 and an example nonvolatile memory cell structure 720. The SRAM cell structure 710 and the nonvolatile memory cell structure 720 can be both fabricated by GAA architecture as 3D structures, which enables to combine the SRAM cell structure 710 and the nonvolatile cell structure 720 into a same or similar process flow. For illustration, a flash memory cell structure 720 is used as an example of the nonvolatile memory cell structure 720. The flash memory cell structure 720 can be an electrically erasable programmable read-only memory (EEPROM) cell structure.

The SRAM cell structure 710 can be similar to the SRAM cell structure 300 of FIG. 3A-3D or 420 of FIGS. 4A-4C. The SRAM cell structure 710 can have a circuit similar to the circuit 200 of FIG. 2. As illustrated in FIG. 7, the SRAM cell structure 710 includes a first inverter including transistors M1, M2, M3 (e.g., M1 212, M2 214, M3 216 of FIG. 2 or M1 332, M2 334/354, M3 352 of FIGS. 3A-3D) and a second inverter including transistors M4, M5, M6 (e.g., M4 222, M5 224, M6 226 of FIG. 2 or M4 336/356, M5 358, M6 338 of FIGS. 3A-3D). The first inverter and the second inverter are cross-coupled to each other by coupling node N0 to C1 and node N1 to C0. Source terminals of the transistors M3 and M5 are coupled to ground (GND) line 701 (e.g., 414 of FIGS. 4A-4C). Sources of the transistors M2 and M4 are coupled to a supply voltage $V_{CC}$ provided by a power line 702 (e.g., 438 of FIGS. 4A-4C). Gates of the transistors M1 and M6 are coupled to a word line 703 (e.g., 402 of FIGS. 4A-4C). Sources of the transistors M and M6 are coupled to bit lines 708 and 709, respectively.

As illustrated in FIG. 7, the flash memory cell structure 720 can be an EFPROM cell structure that includes a pair of tri-gate transistor structure 722, 724. The tri-gate transistor structure 722 includes one silicon-oxide-nitride-oxide-silicon (SONOS) transistor T2 and two MOS transistors T1, T3 coupled in series to the node N0 in the SRAM cell structure 710; the tri-gate transistor structure 724 includes one SONOS transistors T5 and two MOS transistors T4, T6 coupled in series to the node N1 in the SRAM cell structure 710. In this way, that the flash memory cell structure 720 and the SRAM cell structure 710 are coupled together. Gates of the MOS transistors T3 and T6 are coupled to a store line 704. Gates of the SONOS transistors T2 and T5 are coupled to an operation (program/erase) line 705. Gates of the MOS transistors T1 and T4 are coupled to a recall line 706. The MOS transistors T1, T3 and the SONOS transistor T2 are coupled in series to a power line 707, while the MOS transistors T4, T6 and SONOS transistor T5 are also coupled in series to the power line 707.

In some examples, each SONOS transistor T2 or T4 is tuned for either ON or OFF state, and the SRAM cell structure 710 can directly be recalled the stored status of the SONOS transistors T2, T4 without a need for a bus.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device comprising:
a semiconductor substrate;
multiple conductive layers vertically stacked along a vertical direction on the semiconductor substrate, the multiple conductive layers comprising a first conductive layer, a second conductive layer, and a third conductive layer that are sequentially stacked together; and
multiple transistors comprising a first transistor and a second transistor in the first conductive layer and a third transistor in the third conductive layer, each transistor comprising a first terminal, a second terminal, and a gate terminal,
wherein first terminals of the first, second, and third transistors are conductively coupled to a first conductive node in the second conductive layer, and
wherein the multiple transistors further comprise: another second transistor in the third conductive layer, and
wherein the first transistor and the third transistor are transistors of a first dopant type, and the second transistor and the another second transistor are transistors of a second dopant type that is different from the first dopant type.

2. The semiconductor device of claim 1, wherein the first conductive layer and the third conductive layer are made of a first conductive material, and
wherein the second conductive layer is made of a second conductive material different from the first conductive material.

3. The semiconductor device of claim 1, wherein the multiple transistors further comprise fourth, fifth, and sixth transistors,
wherein the fourth and sixth transistors are in the first conductive layer, and the fifth transistor is in the third conductive layer, and
wherein first terminals of the fourth, fifth, and sixth transistors are conductively coupled to a second conductive node in the second conductive layer.

4. The semiconductor device of claim 3, further comprising a staircase region configured to separate the first conductive layer, the second conductive layer, and the third conductive layer into two parts that are conductively insulated from each other,
wherein the first transistor and the second transistor are in a first part of the first conductive layer, and the fourth transistor and the sixth transistor are in a second part of the first conductive layer,
wherein the first conductive node is in a first part of the second conductive layer, and the second conductive node is in a second part of the second conductive layer, and
wherein the third transistor is in a first part of the third conductive layer, and the fifth transistor is in a second part of the third conductive layer.

5. The semiconductor device of claim 4, wherein the staircase region comprises first and second staircase sub-regions that are symmetrical to each other,
wherein the semiconductor device further comprises:
a first set of VIAs vertically penetrating through the first staircase sub-region and respectively coupling to conductive pads on the first parts of the first, second, and third conductive layers, and
a second set of VIAs vertically penetrating through the second staircase sub-region and respectively coupling to conductive pads on the second parts of the first, second, and third conductive layers.

6. The semiconductor device of claim 3, further comprising a first metallic layer above the first, second, and third conductive layers,
wherein a first conductive line in the first metallic layer is configured to conductively couple the first conductive node to a gate terminal of the fourth transistor in the first conductive layer and a gate terminal of the fifth transistor in the third conductive layer, and
wherein a second conductive line in the first metallic layer is configured to conductively couple the second conductive node to a gate terminal of the second transistor in the first conductive layer and a gate terminal of the third transistor in the third conductive layer.

7. The semiconductor device of claim 6, wherein second terminals of the first transistor and the sixth transistor in the first conductive layer are coupled to a pair of first signal lines formed in a second metallic layer,
wherein gate terminals of the first transistor and the sixth transistor in the first conductive layer are coupled to a second signal line formed in a third metallic layer, and wherein the first metallic layer, the second metallic layer, and the third metallic layer are vertically stacked together above the multiple conductive layers.

8. The semiconductor device of claim 6, wherein the first conductive line and the second conductive line are conductively insulated from each other in the first metallic layer and extend along a horizontal direction perpendicular to the vertical direction, and
wherein the first conductive line in the first metallic layer is respectively coupled to the gate terminal of the fourth transistor in the first conductive layer, the first conductive node in the second conductive layer, and the gate terminal of the fifth transistor in the third conductive layer with a first set of VIAs penetrating through a first staircase sub-region along the vertical direction, and
wherein the second conductive line in the first metallic layer is respectively coupled to the gate terminal of the second transistor in the first conductive layer, the second conductive node in the second conductive layer, and the gate terminal of the third transistor in the third conductive layer with a second set of VIAs penetrating through a second staircase sub-region along the vertical direction.

9. The semiconductor device of claim 3, comprising a pair of inverters comprising a first inverter having the first, second, and third transistors and a second inverter having the fourth, fifth, sixth transistors, and
wherein the first and sixth transistors are pass gate transistors in the first and second inverters, respectively, the second and fourth transistors are pull up transistors in the first and second inverters, respectively, and the third and fifth transistors are pull down transistors in the first and second inverters, respectively.

10. The semiconductor device of claim 3, wherein second terminals of the second transistor and the fourth transistor in the first conductive layer are conductive coupled to a first supply voltage, and
wherein second terminals of the third transistor and the fifth transistor in the third conductive layer are conductive coupled to a second supply voltage.

11. The semiconductor device of claim 3, wherein the multiple transistors further comprise:
another fourth transistor in the third conductive layer that shares a gate terminal of the fifth transistor.

12. The semiconductor device of claim 3, wherein gate terminals of the first transistor and the second transistor are conductively insulated from each other by a first insulating slit extending along the vertical direction through the first conductive layer onto the second conductive layer, and
wherein gate terminals of the fourth transistor and the sixth transistor are conductively insulated from each other by a second insulating slit extending along the vertical direction through the first conductive layer onto the second conductive layer.

13. The semiconductor device of claim 3, configured to be a 6T SRAM cell.

14. The semiconductor device of claim 13, wherein the 6T SRAM cell is coupled to a nonvolatile memory cell in a gate-all-around (GAA) transistor architecture.

15. The semiconductor device of claim 1, wherein the first dopant type is N dopant type, and the second dopant type is P dopant type.

16. The semiconductor device of claim 1, wherein the semiconductor substrate comprises a first doped region having the first dopant type and a second doped region having the second dopant type, the first doped region and the second doped region being conductively insulated from each other, and
wherein the semiconductor device comprises multiple semiconductor pillars extending through the multiple conductive layers onto the semiconductor substrate, and
wherein the multiple semiconductor pillars comprise a first semiconductor pillar extending onto the first doped region and a second semiconductor pillar extending onto the second doped region.

17. The semiconductor device of claim 16, wherein each of the first semiconductor pillar and the second semiconductor pillar is surrounded by a gate dielectric structure in the first conductive layer and the third conductive layer, and
wherein each of the first semiconductor pillar and the second semiconductor pillar is surrounded by a metallic structure in the second conductive layer.

18. The semiconductor device of claim 17, wherein the first semiconductor pillar comprises a first portion above the multiple conductive layers and a second portion surrounded by the metallic structure in the second conductive layer, and wherein the first portion and the second portion of the first semiconductor pillar are doped with the first dopant type, and
wherein the second semiconductor pillar comprises a third portion above the multiple conductive layers and a fourth portion surrounded by the metallic structure in the second conductive layer, and wherein the third portion and the fourth portion of the second semiconductor pillar are doped with the second dopant type.

19. The semiconductor device of claim 17, wherein the first transistor comprises a first portion of the first conductive layer, a first portion of the second semiconductor pillar surrounded by a first gate dielectric structure in the first conductive layer, and the first gate dielectric structure,
wherein the second transistor comprises a second portion of the first conductive layer, a first portion of the first semiconductor pillar surrounded by a second gate dielectric structure in the first conductive layer, and the second gate dielectric structure, and
wherein the third transistor comprises a portion of the third conductive layer, a second portion of the second semiconductor pillar surrounded by a third gate dielectric structure in the third conductive layer, and the third gate dielectric structure.

20. The semiconductor device of claim 1, configured to be between adjacent conductive slits extending along the vertical direction through the multiple conductive layers onto the semiconductor substrate.

21. A semiconductor device comprising:
a semiconductor substrate;
multiple conductive layers vertically stacked on the semiconductor substrate comprising a bottom conductive layer, a middle conductive layer, and a top conductive layer that are sequentially stacked together;
a first semiconductor pillar vertically penetrating through the multiple conductive layers onto the semiconductor substrate, the first semiconductor pillar comprising a first bottom portion surrounded by the bottom conductive layer, a first middle portion surrounded by the middle conductive layer, and a first top portion surrounded by the top conductive layer;
a second semiconductor pillar vertically penetrating through the multiple conductive layers onto the semiconductor substrate, the second semiconductor pillar comprising a second bottom portion surrounded by the bottom conductive layer, a second middle portion surrounded by the middle conductive layer, and a second top portion surrounded by the top conductive layer; and a plurality of gate dielectric structures comprising a first gate dielectric structure surrounded by the first bottom portion and the bottom conductive layer and a second gate dielectric structure surrounded by the first top portion and the top conductive layer, wherein the first middle portion of the first semiconductor pillar is conductively coupled to the middle conductive layer, wherein the semiconductor substrate comprises a first region having a first dopant type and a second region having a second dopant type different from the first dopant type, wherein the first semiconductor pillar vertically extends onto the first region to form first junctions with the first dopant type, and the second semiconductor pillar vertically extends onto the second region to form second junctions with the second dopant type, and wherein each of the first top portion and the first middle portion of the first semiconductor pillar is configured to be a corresponding first junction and is doped with a first material having the first dopant type, and each of the second top portion and the second middle portion is configured to be a corresponding second junction and is doped with a second material having the second dopant type.

22. The semiconductor device of claim 21,
wherein the plurality of gate dielectric structures comprising a third gate dielectric structure surrounded by the second bottom portion and the bottom conductive layer and a fourth gate dielectric structure surrounded by the second top portion and the top conductive layer, and wherein the second middle portion of the second semiconductor pillar is conductively coupled to the middle conductive layer.

23. The semiconductor device of claim 22, further comprising a plurality of metallic structures in the middle conductive layer,
wherein the plurality of metallic structures comprise:
a first metallic structure surrounded by the first middle portion of the first semiconductor pillar and the middle conductive layer, and
a second metallic structure surrounded by the second middle portion of the second semiconductor pillar and the middle conductive layer.

24. The semiconductor device of claim 22, wherein the bottom conductive layer comprises: a first conductive portion surrounding the first gate dielectric structure and the first semiconductor pillar and a second conductive portion surrounding the third gate dielectric structure and the second semiconductor pillar, the first conductive portion and the second conductive portion at least partially overlapping with each other between the first gate dielectric structure and the second gate dielectric structure, and
wherein the top conductive layer comprises: a third conductive portion surrounding the second gate dielectric structure and the first semiconductor pillar and a fourth conductive portion surrounding the fourth gate dielectric structure and the second semiconductor pillar, the third conductive portion and the fourth conductive portion being separated and insulated from each other between the third gate dielectric structure and the fourth gate dielectric structure.

25. The semiconductor device of claim 22, further comprising:
a third semiconductor pillar vertically penetrating through the multiple conductive layers onto the semiconductor substrate, the third semiconductor pillar comprising a third bottom portion in the bottom conductive layer, a third middle portion surrounded by the middle conductive layer, and a third top portion surrounded by the top conductive layer, wherein the plurality of gate dielectric structures comprising a fifth gate dielectric structure surrounded by the third bottom portion and the bottom conductive layer and a sixth gate dielectric structure surrounded by the third top portion and the top conductive layer, and wherein the third middle portion of the third semiconductor pillar is conductively coupled to the middle conductive layer; and
a fourth semiconductor pillar vertically penetrating through the multiple conductive layers onto the semiconductor substrate, the fourth semiconductor pillar comprising a fourth bottom portion in the bottom conductive layer, a fourth middle portion surrounded by the middle conductive layer, and a fourth top portion surrounded by the top conductive layer, wherein the plurality of gate dielectric structures comprising a seventh gate dielectric structure surrounded by the fourth bottom portion and the bottom conductive layer and an eighth gate dielectric structure surrounded by the fourth top portion and the top conductive layer, and wherein the fourth middle portion of the fourth semiconductor pillar is conductively coupled to the middle conductive layer.

26. The semiconductor device of claim 25, further comprising a metallic layer above the multiple conductive layers,
wherein the middle conductive layer comprises a first portion where the first and second semiconductor pillars penetrate through and a second portion where the third and fourth semiconductor pillars penetrate through, the first portion and the second portion being insulated from each other,
wherein a first conductive line in the metallic layer is configured to conductively couple the first portion of the middle conductive layer to a portion of the top conductive layer surrounding the fourth semiconductor pillar and the eighth gate dielectric structure and a portion of the bottom conductive layer surrounding the third semiconductor pillar and the fifth gate dielectric structure, and
wherein a second conductive line in the metallic layer is configured to conductively couple the second portion of the middle conductive layer to a portion of the top conductive layer surrounding the first semiconductor pillar and the third gate dielectric structure and a portion of the bottom conductive layer surrounding the second semiconductor pillar and the second gate dielectric structure.

27. A memory device comprising:
a plurality of memory cells on a semiconductor substrate; and
a metallic layer formed above the plurality of memory cells,
wherein each of the plurality of memory cells comprises:
multiple conductive layers vertically stacked on the semiconductor substrate, the multiple conductive layers comprising a first conductive layer, a second conductive layer, and a third conductive layer that are sequentially stacked together; and multiple transistors comprising six transistors, each of the six transistors comprising a first terminal, a second terminal, and a gate terminal, wherein first, second, fourth, sixth transistors are in the first conductive layer and third and fifth transistors are in the third conductive layer, and wherein first terminals of the first, second, and third transistors are conductively coupled to a first conductive node in the second conductive layer, and first terminals of the fourth, fifth, and sixth transistors are conductively coupled to a second conductive node in the second conductive layer, wherein a first conductive line in the metallic layer is configured to conductively couple the first conductive node to a gate terminal of the fourth transistor in the first conductive layer and a gate terminal of the fifth transistor in the third conductive layer, and wherein a second conducive line in the metallic layer is configured to conductively couple the second conductive node to a gate terminal of the second transistor in the first conductive layer and a gate terminal of the third transistor in the third conductive layer, and wherein the multiple transistors further comprise: another second transistor in the third conductive layer, and wherein the first transistor and the third transistor are transistors of a first dopant type, and the second transistor and the another second transistor are transistors of a second dopant type that is different from the first dopant type.

* * * * *